United States Patent
Le Neel et al.

(10) Patent No.: US 8,242,876 B2
(45) Date of Patent: Aug. 14, 2012

(54) DUAL THIN FILM PRECISION RESISTANCE TRIMMING

(75) Inventors: Olivier Le Neel, Singapore (SG); Pascale Dumont-Girard, Grenoble Cedex (FR); Chengyu Niu, Hopewell Junction, NY (US); Fuchao Wang, Plano, TX (US); Michel Arnoux, Saint Cassien (FR)

(73) Assignees: STMicroelectronics, Inc., Coppell, TX (US); STMicroelectronics (Grenoble) SAS, Grenoble (FR)

( * ) Notice: Subject to any disclaimer, the term of this patent is extended or adjusted under 35 U.S.C. 154(b) by 305 days.

(21) Appl. No.: 12/562,026

(22) Filed: Sep. 17, 2009

(65) Prior Publication Data

US 2010/0073122 A1    Mar. 25, 2010

Related U.S. Application Data

(60) Provisional application No. 61/097,805, filed on Sep. 17, 2008.

(51) Int. Cl.
  *H01C 3/04* (2006.01)
  *H01C 7/02* (2006.01)
(52) U.S. Cl. ............ 338/25; 347/58; 257/519; 257/648; 422/81; 427/529; 427/259
(58) Field of Classification Search .................... 338/25; 347/56, 58, 63; 257/510, 519, 648, 641; 422/68.1, 58, 81, 100–102; 437/186, 46, 437/59; 427/539, 259, 537, 918
See application file for complete search history.

(56) References Cited

U.S. PATENT DOCUMENTS

| | | | | |
|---|---|---|---|---|
| 3,289,046 A | * | 11/1966 | Carr ............................... | 361/772 |
| 3,416,959 A | * | 12/1968 | Cormia ......................... | 427/103 |
| 4,125,854 A | | 11/1978 | McKenny et al. .............. | 357/41 |
| 5,037,766 A | | 8/1991 | Wang .............................. | 437/24 |
| 5,135,888 A | * | 8/1992 | Chan et al. .................... | 438/153 |
| 5,503,878 A | * | 4/1996 | Suzuki et al. .................. | 216/16 |
| 5,623,097 A | * | 4/1997 | Horiguchi et al. ......... | 73/204.15 |
| 5,640,023 A | | 6/1997 | Balasinski et al. ............. | 257/66 |
| 5,821,960 A | * | 10/1998 | Mitani ............................. | 347/58 |
| 6,504,226 B1 | * | 1/2003 | Bryant .......................... | 257/510 |
| 6,891,747 B2 | | 5/2005 | Bez et al. | |

(Continued)

FOREIGN PATENT DOCUMENTS

WO  2005/093868 A1  10/2005

OTHER PUBLICATIONS

Tuite, D. "Resistor Trimming," Electronic Design, ED Online #17261, URL=http://electronicdesign.com/article/power/resistor-trimming17261.aspx, dated Oct. 25, 2007.

(Continued)

Primary Examiner — Kyung Lee
(74) Attorney, Agent, or Firm — Seed IP Law Group PLLC

(57) ABSTRACT

A trimmable resistor for use in an integrated circuit is trimmed using a heater. The heater is selectively coupled to a voltage source. The application of voltage to the heater causes the heater temperature to increase and produce heat. The heat permeates through a thermal separator to the trimmable resistor. The resistance of the trimmable resistor is permanently increased or decreased when the temperature of the resistor is increased to a value within a particular range of temperatures.

19 Claims, 20 Drawing Sheets

U.S. PATENT DOCUMENTS

| | | | |
|---|---|---|---|
| 7,259,040 B2 | 8/2007 | Pellizer et al. | 438/102 |
| 7,338,637 B2* | 3/2008 | Pease et al. | 422/68.1 |
| 7,427,926 B2 | 9/2008 | Sinclair et al. | 340/825.2 |
| 2003/0155591 A1 | 8/2003 | Kreupl | |
| 2004/0021740 A1* | 2/2004 | Bell et al. | 347/63 |
| 2005/0052498 A1* | 3/2005 | Delametter et al. | 347/56 |
| 2007/0189053 A1 | 8/2007 | Pellizzer et al. | |
| 2010/0073122 A1 | 3/2010 | Le Neel et al. | 338/25 |

OTHER PUBLICATIONS

Colgan et al., "Phase formation in Cr-Si thin-film interactions," *Appl. Phys. Lett.* 37(10):938-940, Nov. 15, 1980.

Galatsis et al., "p- and n-type Fe-doped $SnO_2$ gas sensors fabricated by the mechanochemical processing technique," *Sensors and Actuators B* 93:562-565, 2003.

Hui Chong Vince Ng et al., "Lateral Connection for a Via-Less Thin Film Resistor," U.S. Appl. No. 12/862,589, filed Aug. 24, 2010, 50 pages.

Hwang et al., "A novel structured polysilicon thin-film transistor that increases the on-off current ratio," *Semicond. Sci. Technol.* 18:845-849, 2003.

Olivier Le Neel et al., "Multi-Layer Via-Less Thin Film Resistor," U.S. Appl. No. 12/862,594, filed Aug. 24, 2010, 48 pages.

Olivier Le Neel et al., "Thermo Programmable Resistor Based ROM," U.S. Appl. No. 12/981,379, filed Dec. 29, 2010, 79 pages.

Olivier Le Neel et al., "Thin Film Metal-Dielectric-Metal Transistor," U.S. Appl. No. 12/981,375, filed Dec. 29, 2010, 48 pages.

Privitera et al., "Morphological and electrical characterization of $Si_xCr_yC_zB_v$ thin films," *Microelectronic Engineering* 87:430-433, 2010.

Sukhawuttichai et al., "Effect of $Bi_2O_3$ Addition on the Microstructure and Properties of the $SnO_2$ Varistor System," *33rd Congress on Science and Technology of Thailand*, Walailak University, Nakhon Si Thammarat, Thailand, Oct. 18-20, 2007, pp. 1-4.

Ting Fang Lim et al., "Via-Less Thin Film Resistor with a Dielectric Cap," U.S. Appl. No. 12/862,599, filed Aug. 24, 2010, 46 pages.

Yamauchi et al., "Polysilicon Thin-Film Transistors with Channel Length and Width Comparable to or Smaller than the Grain Size of the Thin Film," *IEEE Transactions on Electron Devices* 38(1):55-60, Jan. 1991.

Hieber, K., and R. Dittman, "Structural and Electrical Properties of $CrSi_2$ Thin Film Resistors," *Thin Solid Films* 36(2):357-360, Aug. 1976.

Nishida, I., and T. Sakata, "Semiconducting Properties of Pure and Mn-Doped Chromium Disilicides," *Journal of Physics and Chemistry of Solids* 39(5):499-505, Jan. 1978.

Nishida, S., et al., "A New Self-Aligned A-SI TFT Using Ion Doping and Chromium Silicide Formation," *Materials Research Society Proceedings* 219:303-308, Apr. 1991.

\* cited by examiner

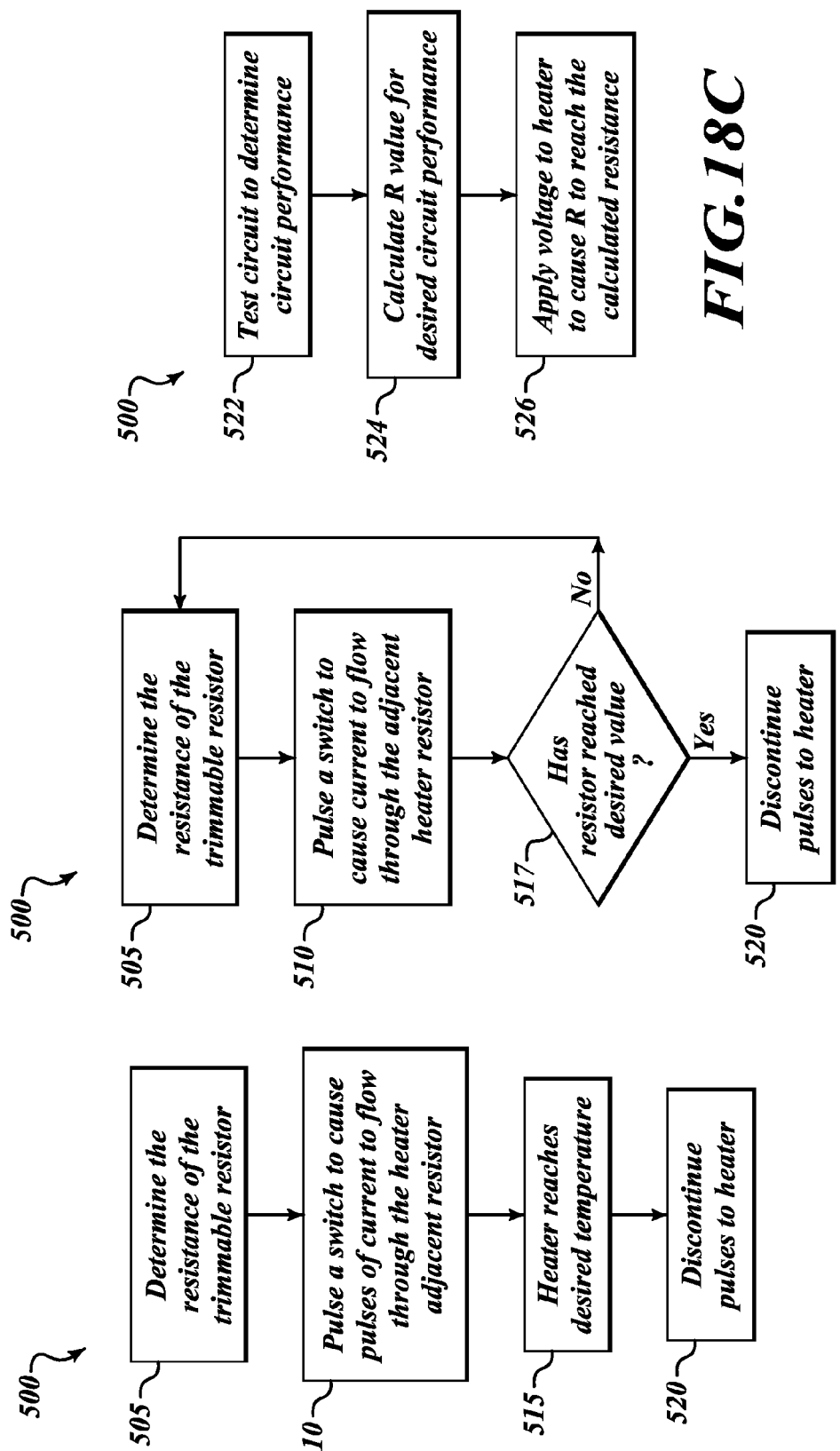

DUAL THIN FILM PRECISION RESISTANCE TRIMMING

BACKGROUND

1. Technical Field

This description generally relates to the field of resistance trimming.

2. Background

Traditional methods of trimming resistors which are embedded within integrated circuits are limited to pre-assembly stages of manufacturing or require forfeiture of significant silicon real estate to obtain precision trims. One method includes using a laser to cut away portions of the resistor to alter its resistance. This method requires access to the fabrication layer in which the resistor is deposited. Additionally, this method cannot be accomplished during the application of the device containing the resistor. Another method includes electrical fusing. Electrical fusing, however, is limited to a binary correction of the resistance. In the alternative, electrical fusing may utilize large fuse bank structures to produce more precise changes in resistance. The tradeoff for more precise resistance trimming then becomes forfeiture of valuable silicon real estate. In summary, traditional resistor trimming methods require visible access to the resistor of interest, or the methods require forfeiture of silicon real estate to effectuate precise results.

BRIEF SUMMARY

The following disclosure relates to a method of trimming a resistor using a heater disposed in close proximity to the resistor in an integrated circuit. By applying a voltage to the heater, the temperature of the heater will increase. The generated heat permeates through a thermal conductor to the resistor, raising the temperature of the resistor. The composition of the resistor material is selected to be of a type that the resistance value of the resistor permanently changes based on the temperature the resistor is exposed to. Separating the heater from the resistor by one or more thermal separators and applying a voltage to the heater results in changing the resistance of the resistor. The resistance can be set at a selected value over a wide range of possible resistances.

In one embodiment, the resistor is connected to an amplifier in a feedback configuration that will affect the gain. The gain of an operational amplifier ("op amp") circuit can be controlled by the value of a feedback resistor. If a precise gain is needed by the circuit, the feedback resistor can be precisely tuned to achieve a desired op amp performance.

In another embodiment, the resistor is trimmed and used in a current sense configuration. In a current sense configuration, a resistor may be placed across the input terminals of an op amp. The op amp is used to sense and amplify the voltage drop across the resistor. Knowing the exact resistance of the resistor and the gain of the op amp will allow one to determine the amount of current flowing through the resistor for evaluating the parameter of interest. The value of the resistor can be more precisely set than just using standard process manufacturing techniques. The value of the resistance of the resistor will affect the range of currents detectable by the current sense configuration. For some sense circuits, a very low resistor may be preferred, while in other types of sense circuitry a higher resistance will provide more accurate sensing and better circuit performance. Thus, the ability to adjust the resistor may improve the effectiveness of a current sense circuit.

According to the embodiments provided herein, the value of the resistor can be modified after the integrated circuit is completed as well as at numerous different stages in the process. After the circuit has been completely formed, the circuit performance can be tested to determine the characteristics and parameters of the individual circuit components and transistor operation. The desired resistance value can be determined based on these tests.

When a circuit is designed, it is designed towards a target performance and specification. When the circuit is actually construed in silicon, the actual performance of the various components, such as transistors, capacitors and resistors, will be slightly different from the designed target value. One of the most difficult components to build to the exact design specifications is a resistor in silicon or polysilicon or a HIPO resistor. Accordingly, the circuit can be tested after it is constructed to determine the actual performance of the components. It can be tested at several locations, for example, the sheet resistance of the resistor can be tested, or the performance of the circuit, or the gain of the amplifier or some other results of the circuit can be tested to determine the actual characteristics of the circuit as actually formed. After this step, the resistance value needed to achieve a desired performance can be calculated. Then, the value of the resistance can be modified to be closer to the target value so that the circuit performs closer to the target specification.

As explained in more detail herein, after one or more tests are performed, the resistance is modified to have a more exact resistance value to provide the preferred performance characteristics for the particular circuit. The proper voltage is applied to the heater to cause the heater to reach desired temperature for heating of the resistor. The resistor is heated to a selected temperature which will cause it to reach a permanent resistance value. The heater is then turned off, and the resistance value of the resistor will have been placed at the desired value in order to achieve the preferred circuit performance. The value of the resistance has therefore been trimmed to a precise desired value.

This trimming of the resistor can occur at many different stages in the circuit process. It can occur at the wafer test stage in which the wafer is tested for circuit performance and operation, as is often done to test op amp performance or circuit feedback characteristics. Once the op amp characteristics are known from the test during the wafer testing, the preferred value of the resistance can be calculated and thereafter the appropriate voltage applied to the heater to cause the resistor to be trimmed to the selected resistance.

Alternatively, the resistive trim stage can occur at the individual die stage. After the wafer has been diced and individual dies are separated, in some embodiments, the die may be tested prior to packaging. Each individual die may be tested to determine the actual circuit parameters and then a desired resistance value. At this stage, the appropriate probes can be applied in order to heat the resistor to the desired value and therefore trim the resistance.

Alternatively, the resistor trimming can occur after the die is packaged. In this embodiment, the die is completely packaged and ready for use. Just prior to shipment, the manufacturer may place the die in a test socket and test various components of the circuit operation. If one or more resistors have a value which needs modification, then a voltage can be applied to the appropriate heater and the resistance can be modified to have the selected value in order to provide the desired circuit performance.

Alternatively, the purchaser of the chip may also trim the resistor just prior to using it in an end circuit. The user, upon purchase of the chip in its complete package form, may perform various tests on the integrated circuit package according to their desired end use of the completed circuit. The user can determine what resistance value is preferred and, by applying appropriate voltage to the terminals of the package, heat the resistor to the selected value and thus change the resistor to have a value which provides the preferred circuit performance.

In summary, the value of the resistance can be trimmed at various stages in the product cycle, including at the initial manufacturing stage, at the wafer probe test stage, at the die test stage, at the packaged test stage, or, in some embodiments, even by the user after the chip has been purchased on the commercial market. This provides a wide range of alternative stages over which the value of the resistor can be trimmed well beyond what was possible in the prior art.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. Further, some figures are in schematic form and the particular shapes of some of the elements as drawn are not intended to convey information regarding the actual shape of the particular elements and have been selected for ease of recognition in the drawings.

FIGS. 18A-18C are flowcharts illustrating various methods of trimming a trimmable resistor, in accordance with embodiments of the invention.

DETAILED DESCRIPTION OF EMBODIMENTS OF THE INVENTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures and methods associated with integrated circuits and semiconductor manufacturing/packaging processes have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

Figure 1:
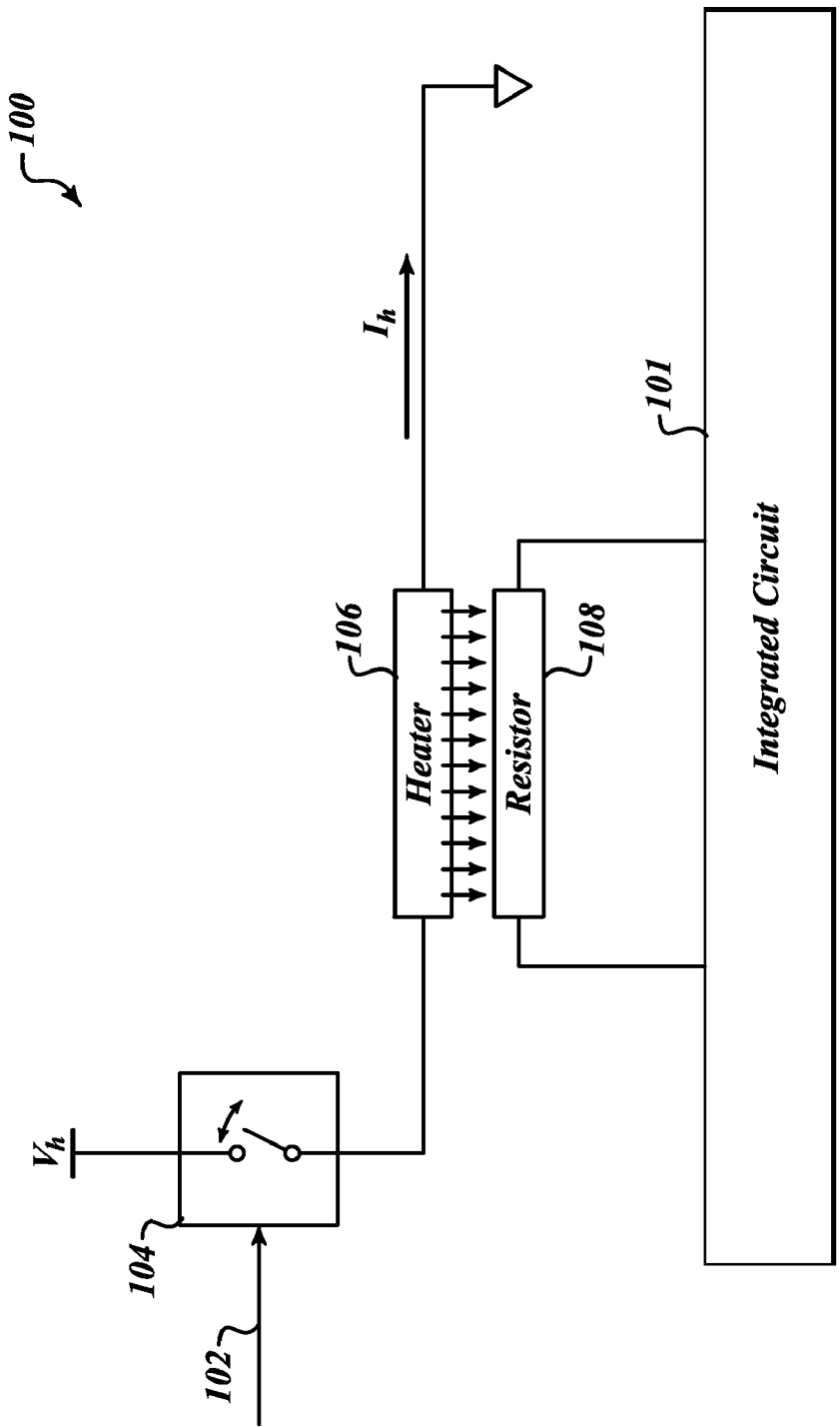
FIG. 1 is block diagram illustrating resistor trimming, in accordance with an embodiment of the invention.

FIG. 1 shows one embodiment of a trimming system 100 for trimming or changing the sheet resistance of a resistor. The embodiment includes an integrated circuit 101, an input signal 102, a switch 104, a heater 106, and a resistor 108. Additionally, trimming system 100 has a voltage source $V_h$, which provides a current $I_h$ to flow through heater 106. The resistor 108 is connected to an integrated circuit, shown here only in block diagram form.

Switch 104 is connected to heater 106 to selectively supply a voltage $V_h$. The switch opens and shuts in response to input signal 102. In one embodiment input signal 102 is a single pulse. In another embodiment, input signal 102 is a series of pulses. Switch 104 can be implemented using a variety of devices, including a transistor, either bipolar or MOS, or a triac, thyristor, or other switchable supply of a heating current $I_h$.

Heater 106 receives a voltage potential $V_h$ from switch 104. The value of the voltage potential $V_h$ is selected to achieve a desired current $I_h$ through the heater 106 based on the type of switch 104 used. In some instances, in which the switch 104 is an on/off switch that provides the full value $V_h$ to the heater 106, the value of $V_h$ is selected to provide a desired current $I_h$ for heating the resister. This can be either a single pulse of a given voltage or, preferably, as a series of small pulses so that each incremental pulse provides incremental heating of the heater 106. A pulse wave modulation signal (PWM) can be applied via signal 102 to the switch 104. Alternatively, the voltage $V_h$ can be a known rail voltage, such as Vcc, Vpp, or other voltage rail available on the integrated circuit. In this case, the signal 102 can be applied as a pulse width modulation signal to provide short pulses of current flow $I_h$ to the heater 106. Alternatively, the signal 102 can be an analog-driven signal to provide a selected current flow through the heater 106. In such instances of an analog drive signal 102, a bipolar transistor is preferred for the switch 104. In other instances, a triac, thyristor, or MOS transistor may be used for the switch 104 in order to achieve a desired temperature in the heater 106.

Current I selectively flows through heater 106 to cause power to dissipate in the device. The temperature of the heater is defined by the Joule effect of power dissipation. This effect is mathematically represented as:

$$Q = R_{heater} \times (I_{heater})^2 \times t,$$

where
Q=the heat generated by a constant flow of current;
$R_{heater}$=the resistance of the heater;
$I_{heater}$=the current flowing through the resistor; and
t=time, the duration current is flowing through the resistor.
Power dissipating in heater 106 results in the temperature of heater 106 increasing. As will be discussed in association with FIG. 7, the composition of heater 106 will affect its resistance and therefore thermal response to current I passing through it. The heat generated by heater 106 permeates to resistor 108.

Resistor 108 is depicted in trimming system 100 as being in close proximity to heater 106. The proximity of resistor 108 to heater 106 will, in part, determine the amount of heat transferred between the devices, i.e., the thermal coupling. Whereas the resistance of many resistors temporarily varies with temperature, resistor 108 is of a type that will permanently change resistance upon exposure to a temperature within a range of temperatures. It can be of a type in which the resistance increases when subjected to heat, or the resistance decreases when subjected to heat.

A trimmable resistor, such as resistor 108, adds tremendous value to integrated circuit manufacturing in the way of precision while requiring very little additional hardware overhead. A voltage source is already available on all integrated circuits and in any wafer probe test. In addition, switches 104 are also available in standard integrated circuits 101. The additional hardware of a heater 106 and heater control circuit will be provided, however, such heaters and control circuits can easily be formed in standard integrated circuit processes and will only take up a small amount of space. A trimmable resistor such as is disclosed herein allows a large spectrum of trimming capabilities. In one embodiment, resistor 108 is part of a low-pass or high-pass RC filter where resistor 108 is inversely proportional to the cut-off frequency. In another embodiment, resistor 108 is the gain controlling feedback resistor of an amplifier circuit. In yet another embodiment, resistor 108 is a current sense resistor which may be connected across the inputs of a current sense amplifier. Since integrated circuits which produce results to within tight tolerances of the customer specification are of more value and if far outside of a customer specification often have to be discarded or sold undervalue, the ability to produce higher precision circuits becomes immensely valuable in a circuit manufacturing environment.

Figure 2:
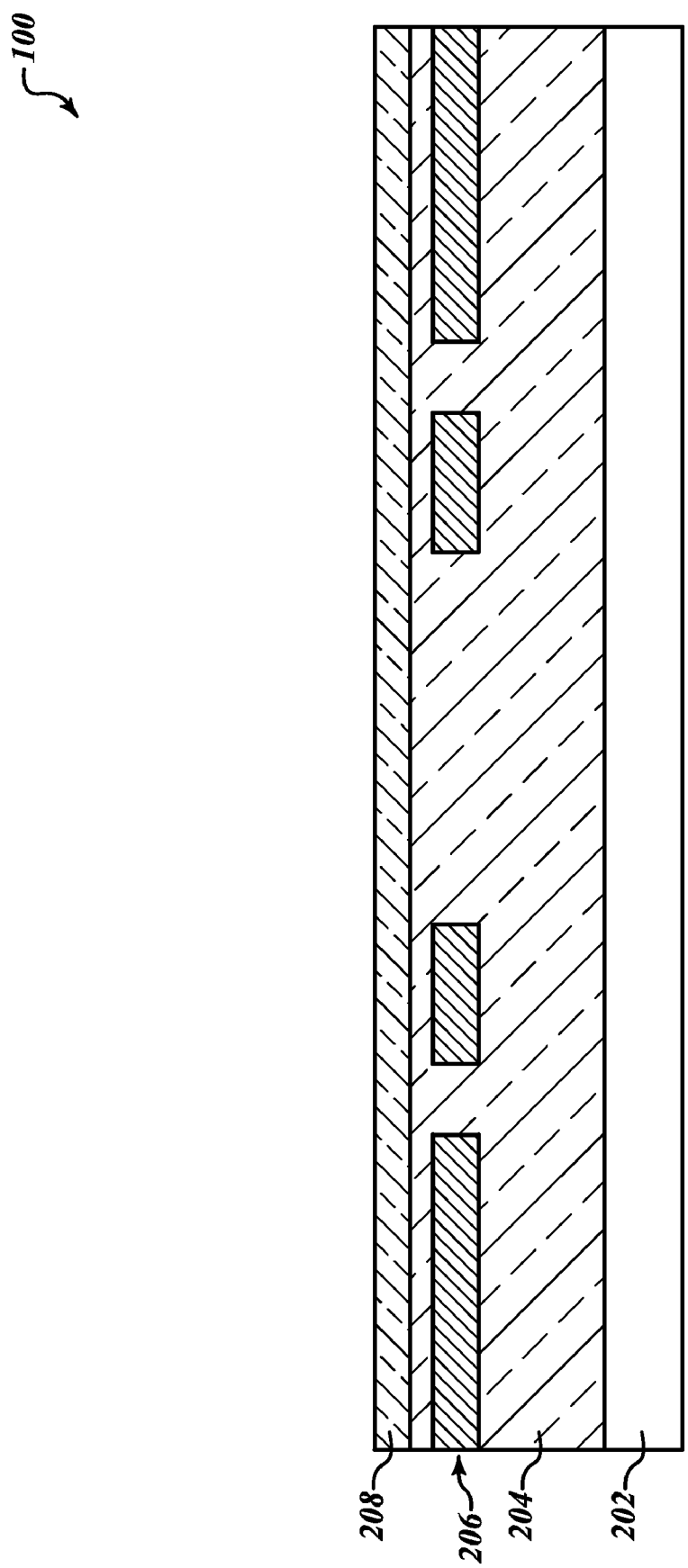
FIGS. 2 through 11 are cross-sectional views illustrating the plurality of processing steps that may be used in manufacturing the layers associated with the heater and trimmable resistor of FIG. 1, in accordance with an embodiment of the invention.

FIG. 2 shows a cross-sectional view of layers representing the integrated circuit 101 used in the fabrication of portions of trimming system 100. Trimming system layers 100 includes a silicon substrate 202, an insulator 204, a metal layer 206, and a layer 208.

Figure 16:
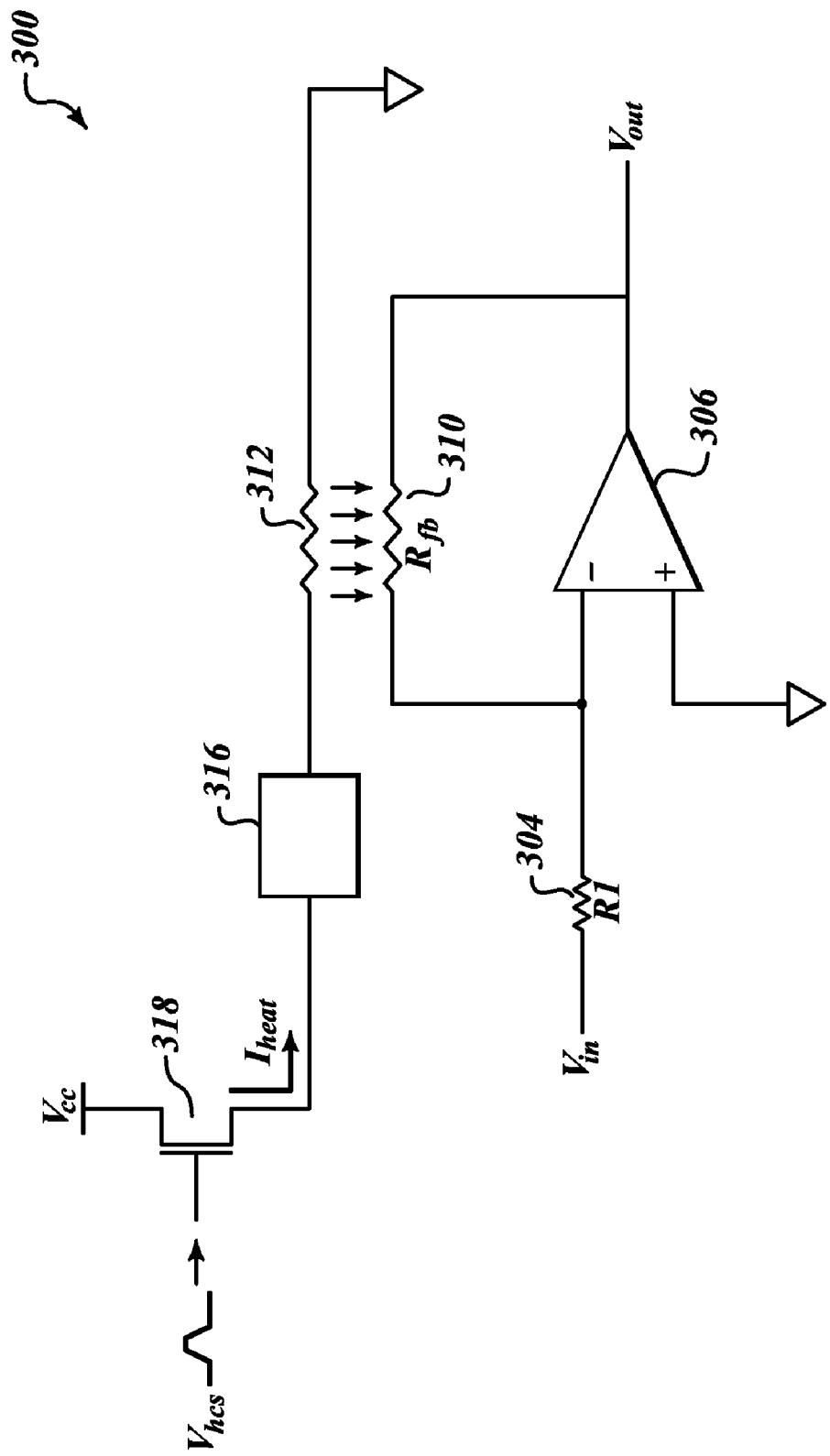
FIG. 16 is a circuit diagram illustrating an amplifier configuration using the trimmable resistor, in accordance with an embodiment of the invention.

Silicon substrate 202 may be a substrate of monosilicon. It may be a layer of polysilicon grown above a substrate or another process layer on which insulator 204 may be disposed. In one embodiment, silicon layer 202 contains active devices, while in another, it is on top of active devices, consequentially increasing the integration density of an integrated circuit upon which various layers may be disposed. The substrate 202 will have a number of other circuit components formed therein according to techniques well known in the art. For example, substrate 202 will include some or all of the components of the circuit of FIGS. 1, 16 and 17, shown elsewhere herein. The formation of transistors and interconnections to form specific circuits in a semiconductor substrate to make an integrated circuit are well known and therefore not described in detail herein. Any acceptable techniques may be used which are compatible with the processes and layers in the resistive heating circuit described herein.

Insulator 204 prevents various sections of metal layer 206 from having undesirable low-impedance connections. Insulator 204 may be one of many dielectrics known by one of skill in the art, including silicon dioxide ($SiO_2$), phosphosilicate glass (PSG), and boro-phospho-silicate glass (BPSG).

Layer 208 is disposed above insulator 204. Layer 208 acts as a layer that is an etchable foundation for a successive layer. Layer 208 is ideally an inefficient thermal conductor. As such, it protects electrical structures disposed below from heat dissipated in layers above, so as not to substantially impact electrical structures such as metal layers. In one embodiment, layer 208 is made of TEOS with a thermal conductivity on the order of 1.1 W/m/K. Layer 208 is etched to act as a socket for the resistor 108, as explained later herein. In another embodiment, layer 208 is implemented with an air void. In either embodiment, layer 208 is disposed in preparation for the subsequent resistive layer.

Figure 3:
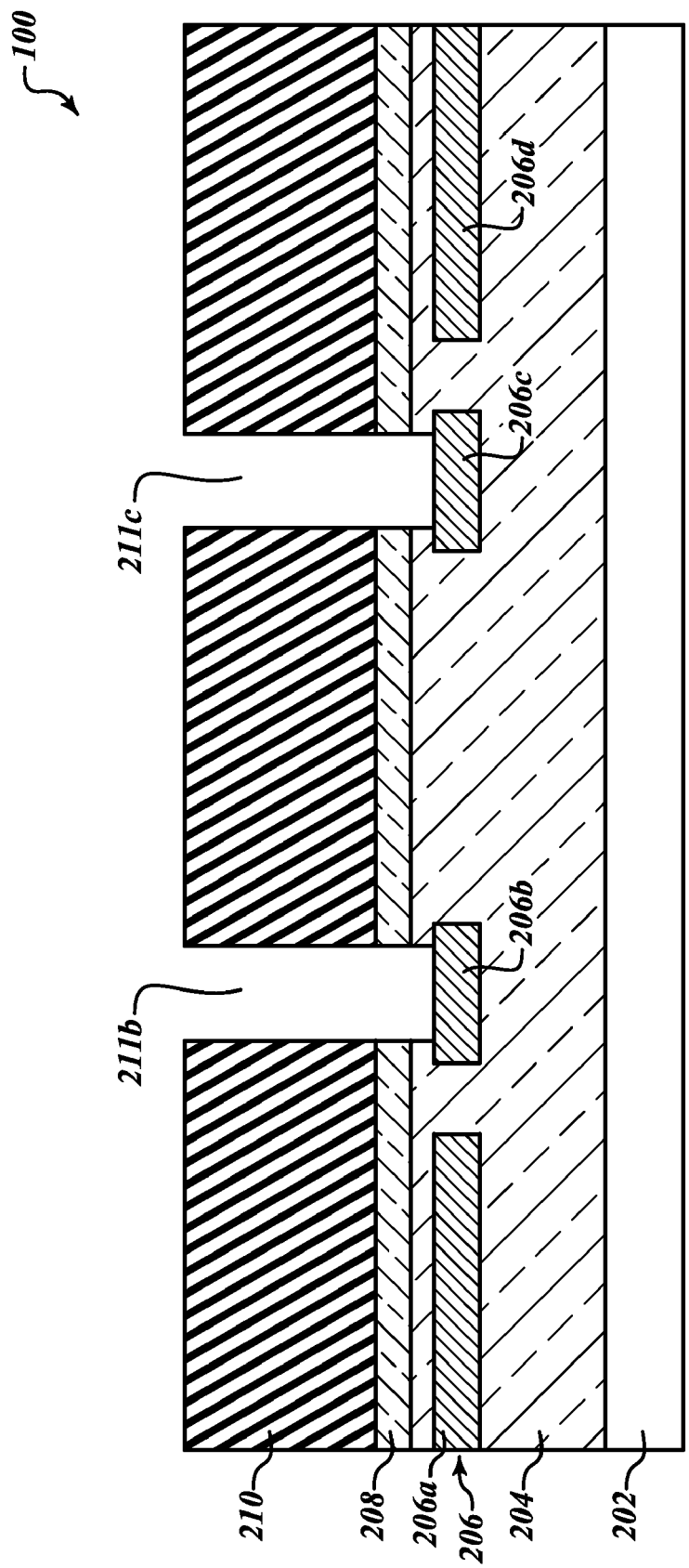

FIG. 3 shows the use of a photoresist 210, which is a temporary layer, within trimming system 100 to create via 211*b* and via 211*c* in layer 208 and insulator 204. The layer 206 has electrical isolated metal structures 206*a*, 206*b*, 206*c*, 206*d*, etc. The openings extend to and expose metal layer 206*b* and 206*c*. By exposing metal layer 206*b* and 206*c*, the next conductive layer may electrically couple to metal layer 206*b* and 206*c*.

Figure 4:
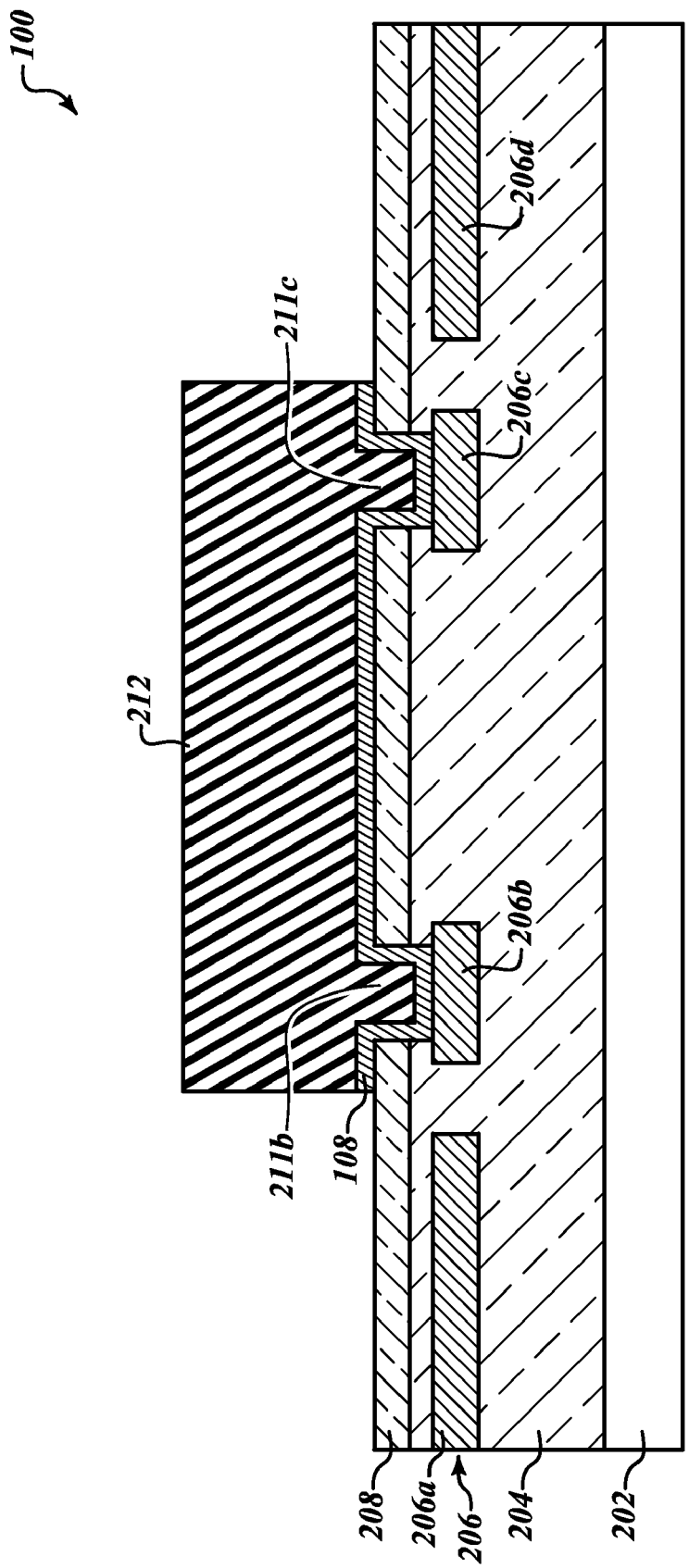

FIG. 4 shows that a resistor 108 has been deposited, the photoresist layer 212 is patterned and etched to obtain the desired dimensions of the resistor 108. Resistor 108 corresponds to trimmable resistor 108 of FIG. 1. Resistor 108 is connected to metal layer 206*b* and 206*c*. Resistor 108 has an initial resistance that is determined by its composition, length, width, and depth. In one embodiment, resistor 108 is a thin film resistor ("TFR"). In one embodiment, resistor 108 is a TFR with an initial sheet resistance of 1 k ohm/sq. Resistor 108 is also composed of material that will permanently change after exposure to a range of temperatures. In one embodiment, resistor 108 comprises CrSi, a material with a low temperature coefficient of resistance. In one embodiment, the range of temperatures which will cause it to change resistance is 450° C. to 850° C.

As to avoid damage to resistor 108 and overheat proximate electrical structures, the duration of exposure of resistor 108 to the range of temperatures will be selectively controlled. In one embodiment, a permanent change in the value of resistor 108 occurs when resistor 108 is exposed to a temperature between 450° C. to 850° C. for a length of time between 1 us and 1 ms. The purpose of the exposure is to permanently change the resistance of resistor 108, without rendering it fully or partially inoperable as a circuit element, as explained in more detail with respect to FIG. 19.

Figure 5:
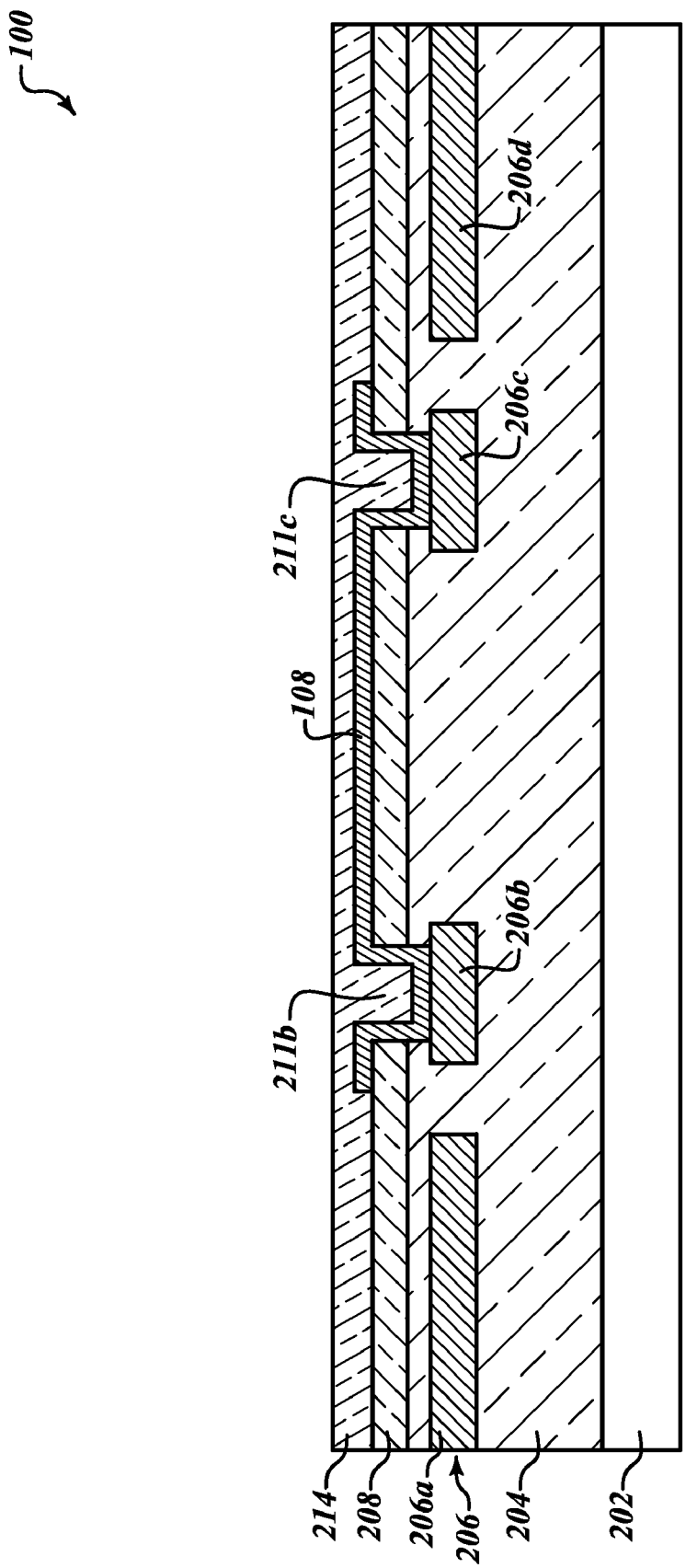

In FIG. 5, photoresist 210 of FIG. 4 has been removed, and a thin film thermal separator 214 has been deposited adjacent to resistor 108. Thin film thermal separator 214 has properties of both a thermal conductor and an electrical insulator. While thin film thermal separator 214 will usually be deposited using a thin film process, in one embodiment thin film thermal separator 214 is an air void. In another embodiment thin film thermal separator 214 is $Si_3N_4$ having a thermal conductivity of approximately 20 W/m/K. In another embodiment thin film thermal separator 214 comprises silicon carbide, $Si_xC_{1-x}$ having a thermal conductivity of approximately 150 W/m/K. Silicon carbide has the property of being hard, very stable and resistant to cracking over wide temperature ranges. The layer 214 is selected to be one that is an electrical insulator and has acceptable thermal properties, namely, it is highly stable and resistant to cracking over a wide range of temperatures, also, it has a thermal coefficient of expansion in a range to match the surrounding layers so it will not cause stress on the resistor 108 or heater 106 as the temperature changes. $Si_3N_4$ and SiC are two acceptable materials. Additionally, thin film thermal separator 214 has a high breakdown voltage, allowing it to withstand a high voltage potential between resistor 108 and the heater 106 to be described in correspondence with FIG. 7.

Figure 6:
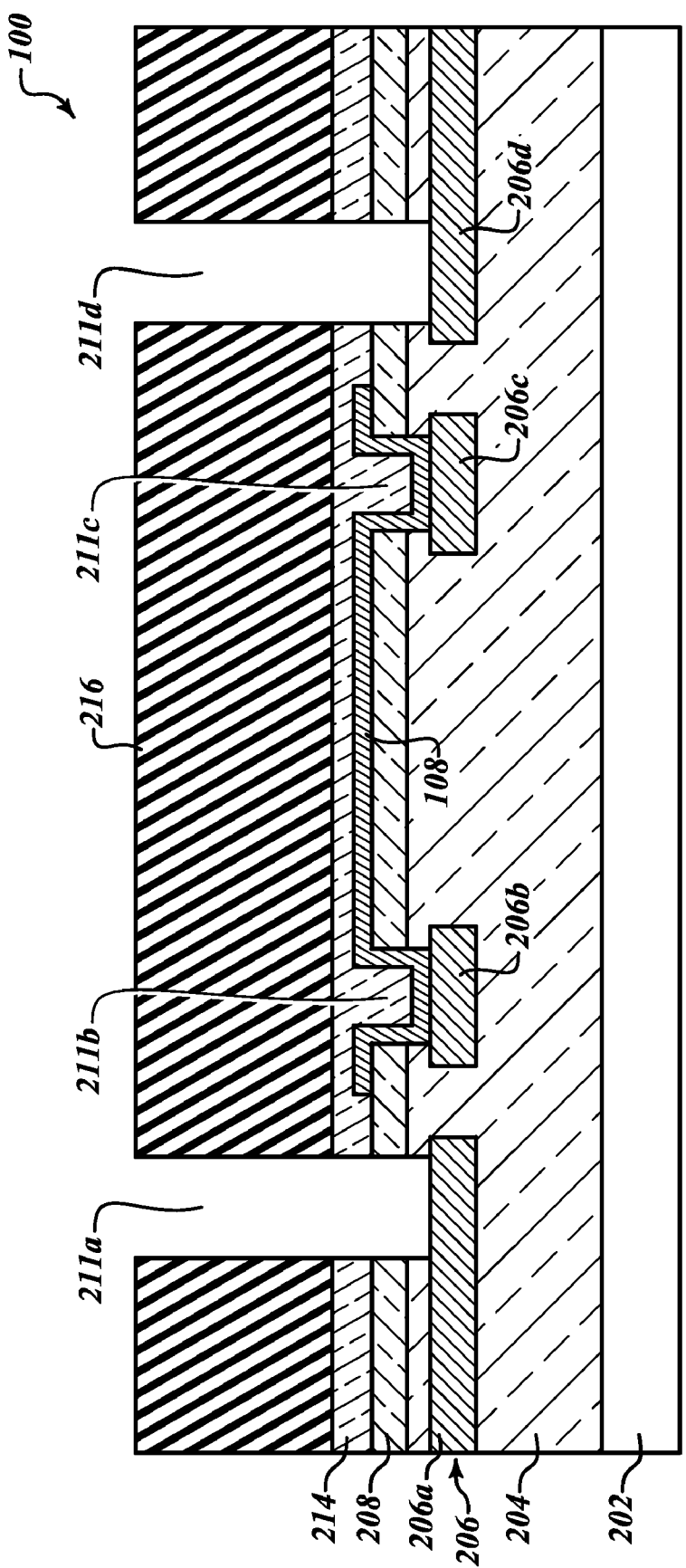

FIG. 6 shows the use of photoresist 216, a temporary layer, within trimming system 100 to create via 211a and via 211d in thin film thermal separator 214, layer 208, and insulator 204. The vias extend to and expose metal layer 206a and 206d. By exposing metal layer 206a and 206d, the next conductive layer will be electrically coupled to metal layer 206a and 206d while still electrically insulated from resistor 108 by means of intervening layers thin film thermal separator 214, layer 208, and insulator 204.

Figure 7:
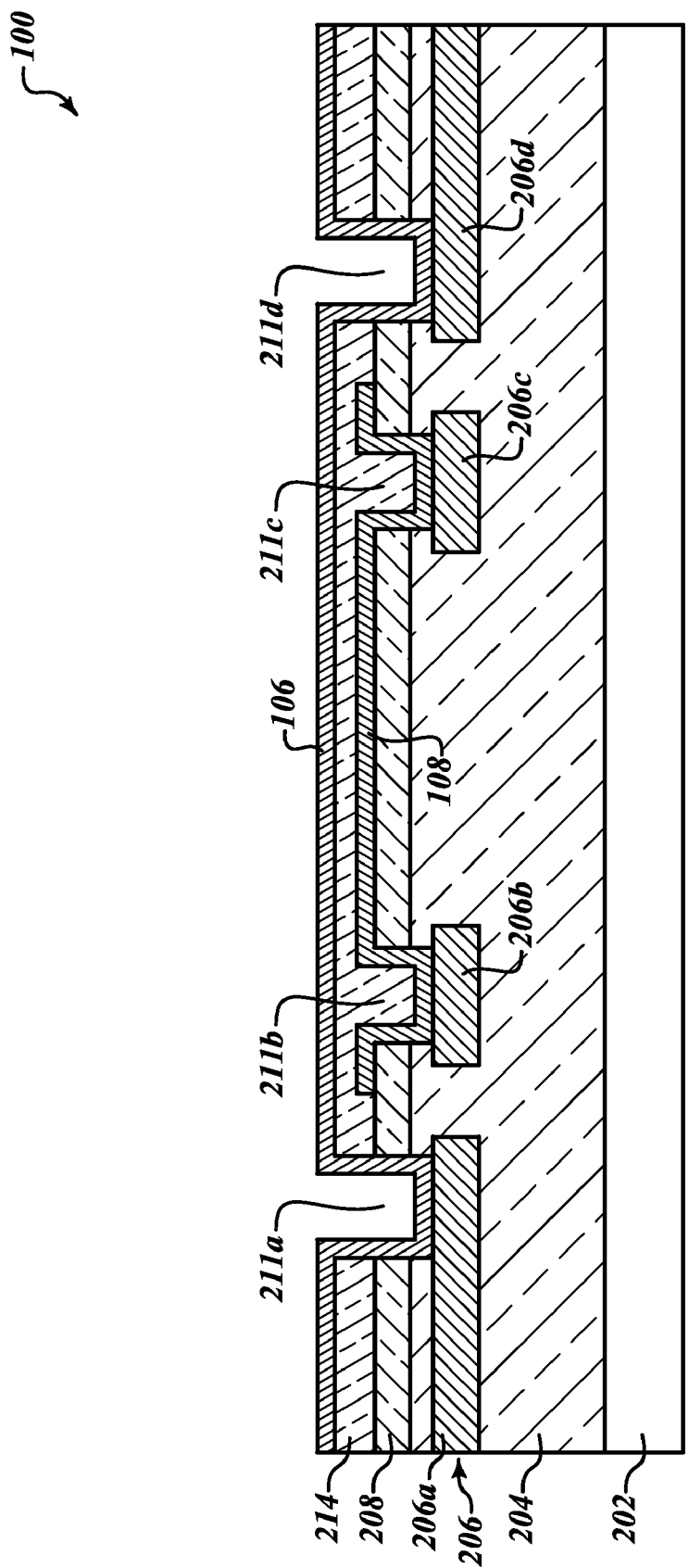

FIG. 7 shows a deposition of a layer to form heater 106 of FIG. 1. Heater layer 106 corresponds to heater 106 of FIG. 1. In one embodiment, heater 106 is deposited over thin film thermal separator 214 via a thin film process. Heater 106 is connected to metal layer 206a and 206d. Heater 106 has heat generating properties determined by its composition, length, width, and depth. In one embodiment, heater 106 is a thin film resistor. In another embodiment, heater 106 comprises TaSiN having a sheet resistance of approximately 100 ohms/sq. Heater 106 comprises a material that can withstand high intensity heat without structural damage. Since some heat transferred from heater 106 to resistor 108 will be dissipated and lost in thin film thermal separator 214, heater 106 needs to be able to exceed beyond 850° C. to bring resistor 108 to that temperature. Finally, heater 106 may contain the following properties: low temperature coefficient of resistance, low noise, high linearity resistance, and integration density for radio frequency devices.

Figure 8:
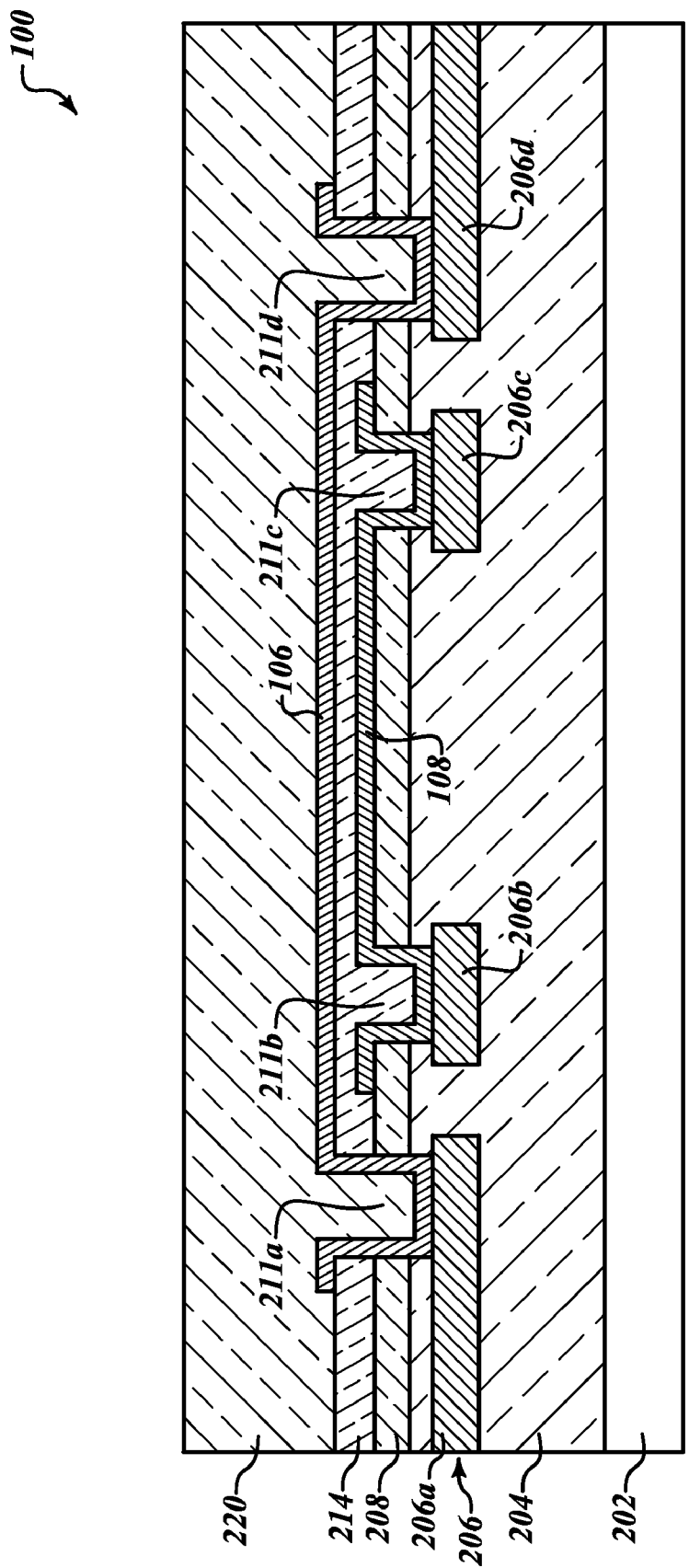
Figure 9:
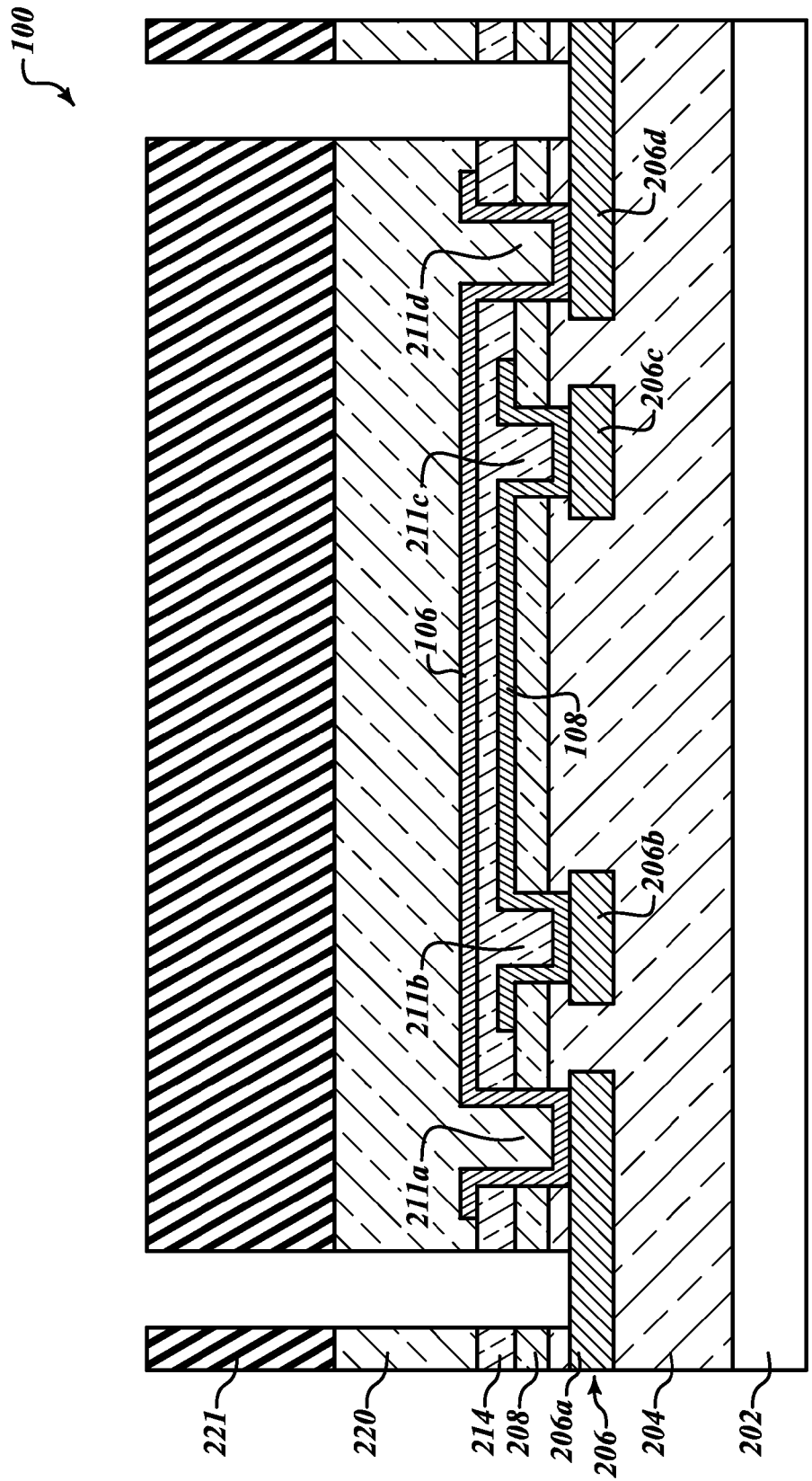
Figure 10:
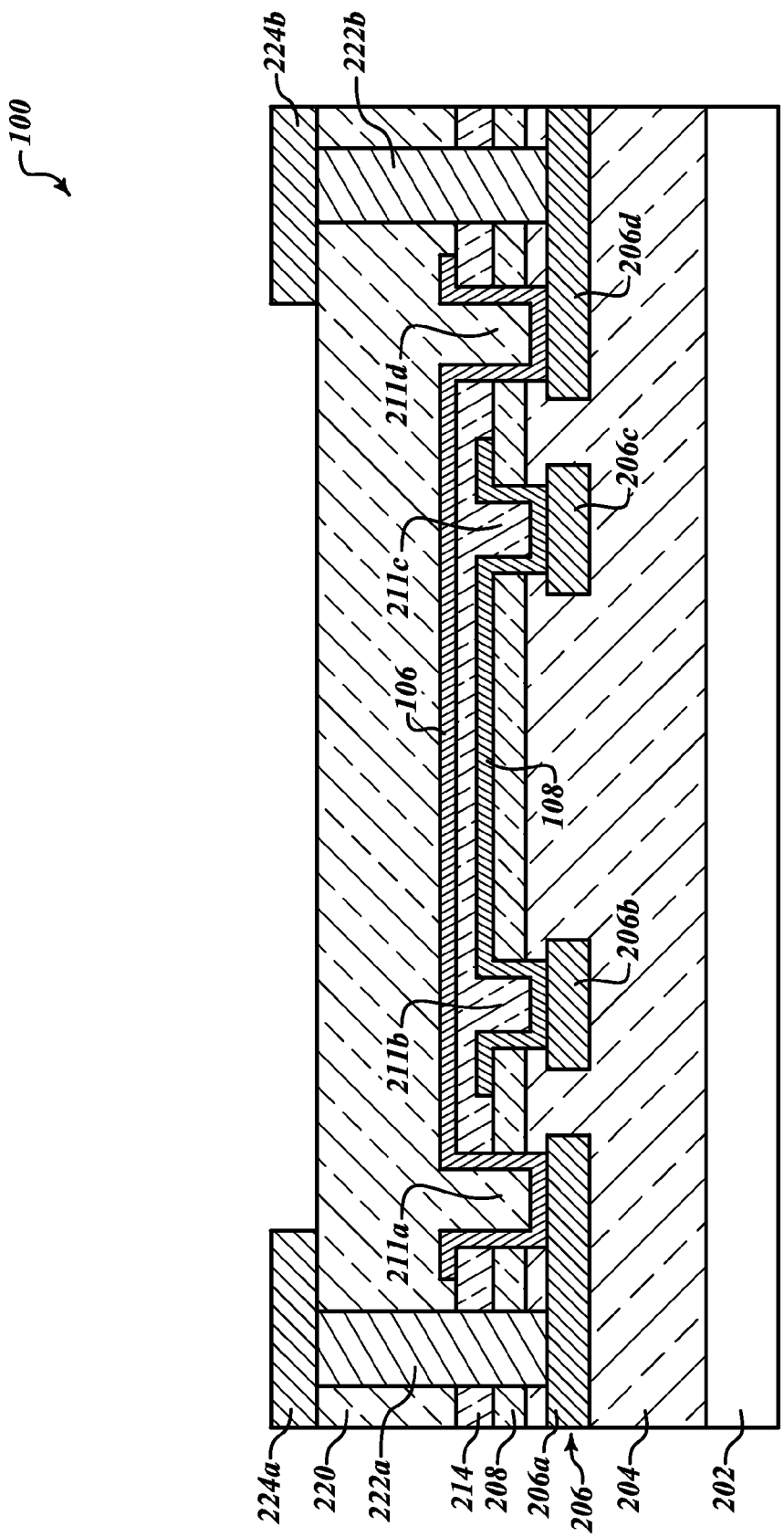
Figure 11:
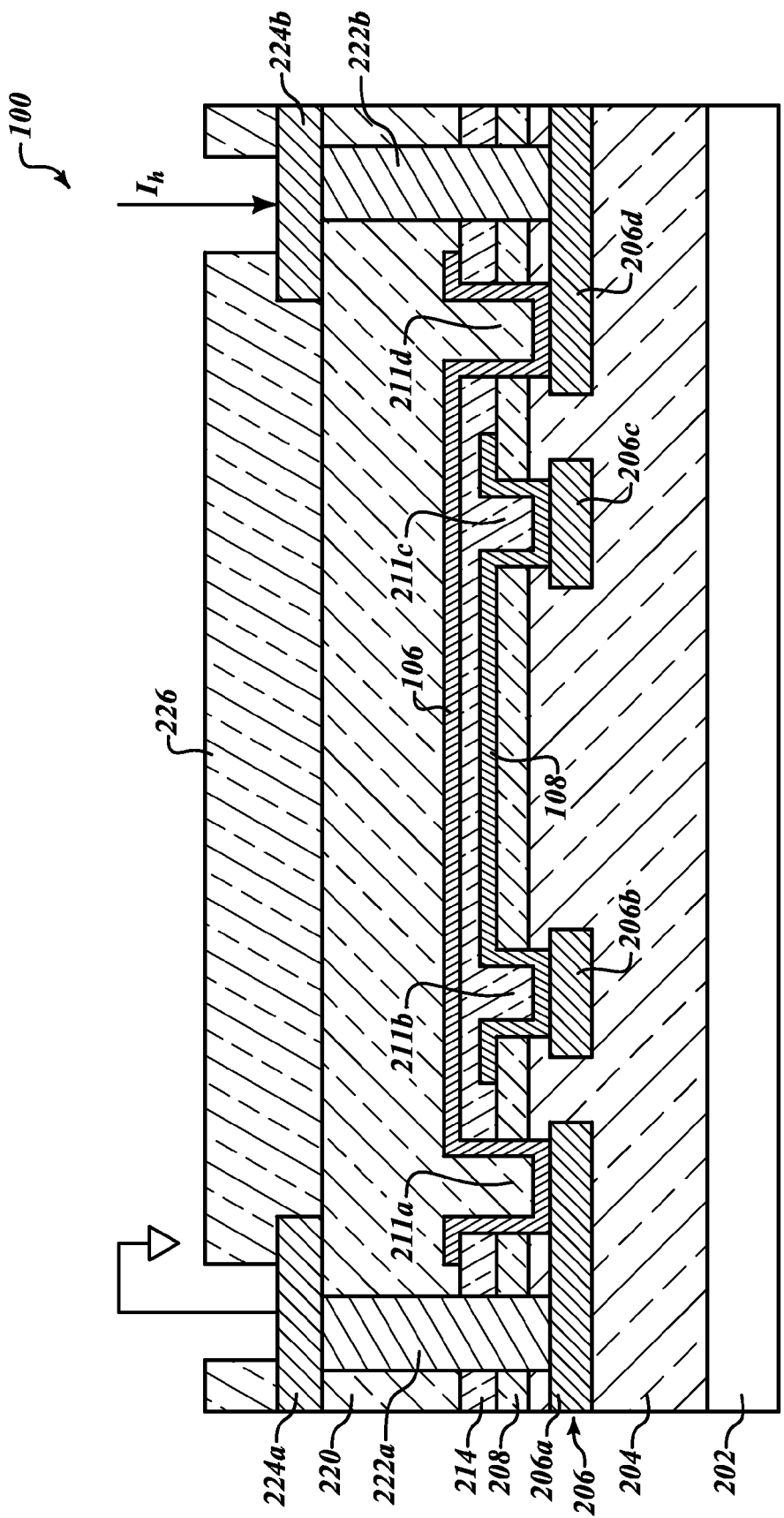

FIG. 8 through FIG. 11 show the process of connecting another metal layer to heater 106. FIG. 8 shows dielectric 220 disposed adjacent heater 106. FIG. 9 shows via openings to metal layer 206a and 206d through use of a pattern in photoresist 221. FIG. 10 shows plug 222a and 222b inserted into the via openings of FIG. 9. FIG. 10 also shows the deposition of metal layer 224a and 224b after a photoresist has been patterned, etched, and removed. Metal layer 224a is deposited onto plug 222a and metal layer 224b onto plug 222b. The physical connection of metal layer 224 to plug 222 to metal layer 206 provides a low resistance path for current to flow to heater 106. As shown, heater 106 shares an electrical connection with plug 222 to metal layer 206. FIG. 11 shows openings in upper layer 226. In one embodiment metal layer 224 is the top-most metal layer and upper layer 226 is a passivation layer. In this embodiment metal layer 224a may be connected to ground and metal layer 224b may be connected to receive current flow $I_h$. It is to be understood, however, that heater 106 is bi-directional and is not to be limited to only having current flow in the direction illustrated in FIG. 11. In another embodiment, upper layer 226 is another inter-metal layer insulator or dielectric upon with another metal layer may be deposited.

The distance between heater 106 and resistor 108 serves several functions. First, the distance acts to provide electrical isolation between the electrical elements. Electrical isolation between the elements allows one or both of heater 106 and resistor 108 to be independently used as a loading resistor or other circuit element such as a thermal sensor. Second, the distance controls the heat transfer characteristics of the trimming system. The smaller the distance between heater 106 and resistor 108, the more easily heat is transferred between the devices. Lastly, two conductors separated by a dielectric form a capacitive element. In FIG. 11, heater 106 forms a first plate, resistor 108 forms a second plate and thermal separator 214 forms a dielectric between the two conductors. The capacitance of the combination of these three elements is governed generally by the equation:

$$C=k*A/d,$$

where
C=the capacitance, the ability of conductors separated by a dielectric to hold a charge;
k=the dielectric constant;
A=the area of overlap between the conductors; and
d=the distance between the conductors.

Thus, the distance between heater 106 and resistor 108 also serves the purpose of inversely controlling the capacitance between the two elements. In one embodiment, connections to heater 106 and resistor 108 are configured to use the two conductive layers and the thin film thermal separator 214 as a capacitor.

Figure 12:
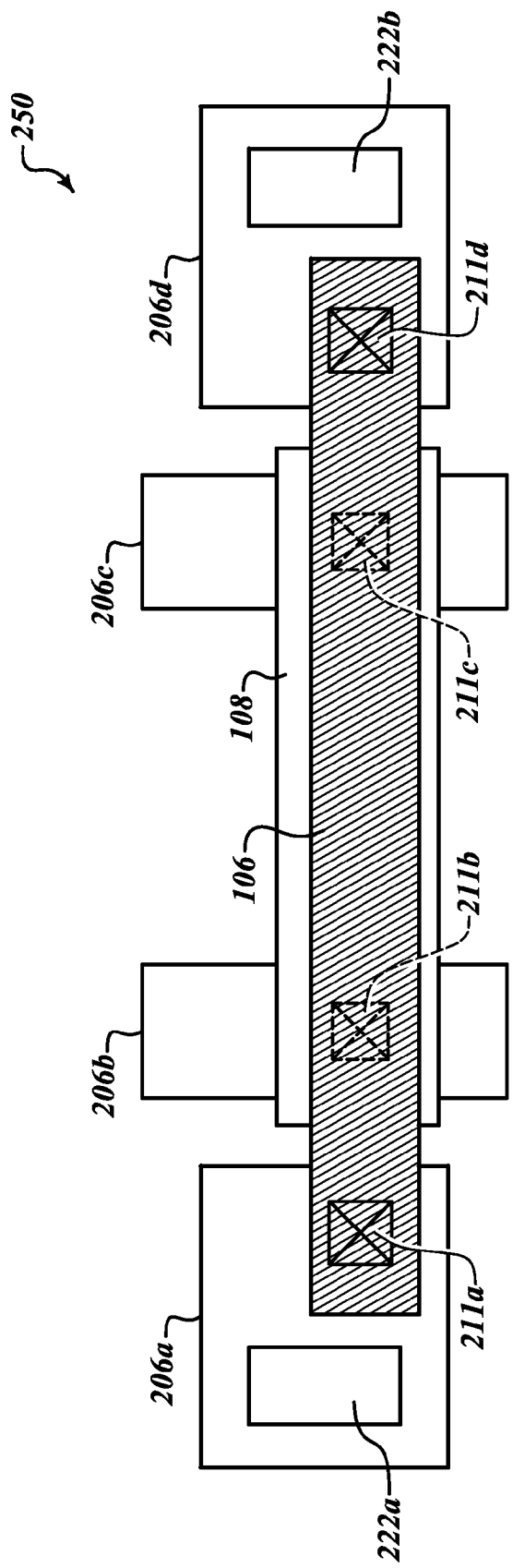
FIG. 12 is a partial-layer top view of the heater and trimmable resistor, in accordance with an embodiment of the invention.

FIG. 12 shows a partial top view of trimming system 100. As shown, heater 106 extends over and along the length of resistor 108. Via connections 211a through 211d illustrate electrical connections between heater 106 and metal layer 206a and 206d as well as connections between resistor 108 and metal layer 206b and 206c. Here, heater 106 is also shown disposed on top of resistor 108. Variations on this orientation may be made that are equivalent, these include: heater 106 being shorter than resistor 108, heater 106 being the same width as or wider than resistor 108, heater 106 being disposed beneath resistor 108, heater 106 being disposed to a side of resistor 108, or heater 106 overlapping only portions of resistor 108.

Figure 13:
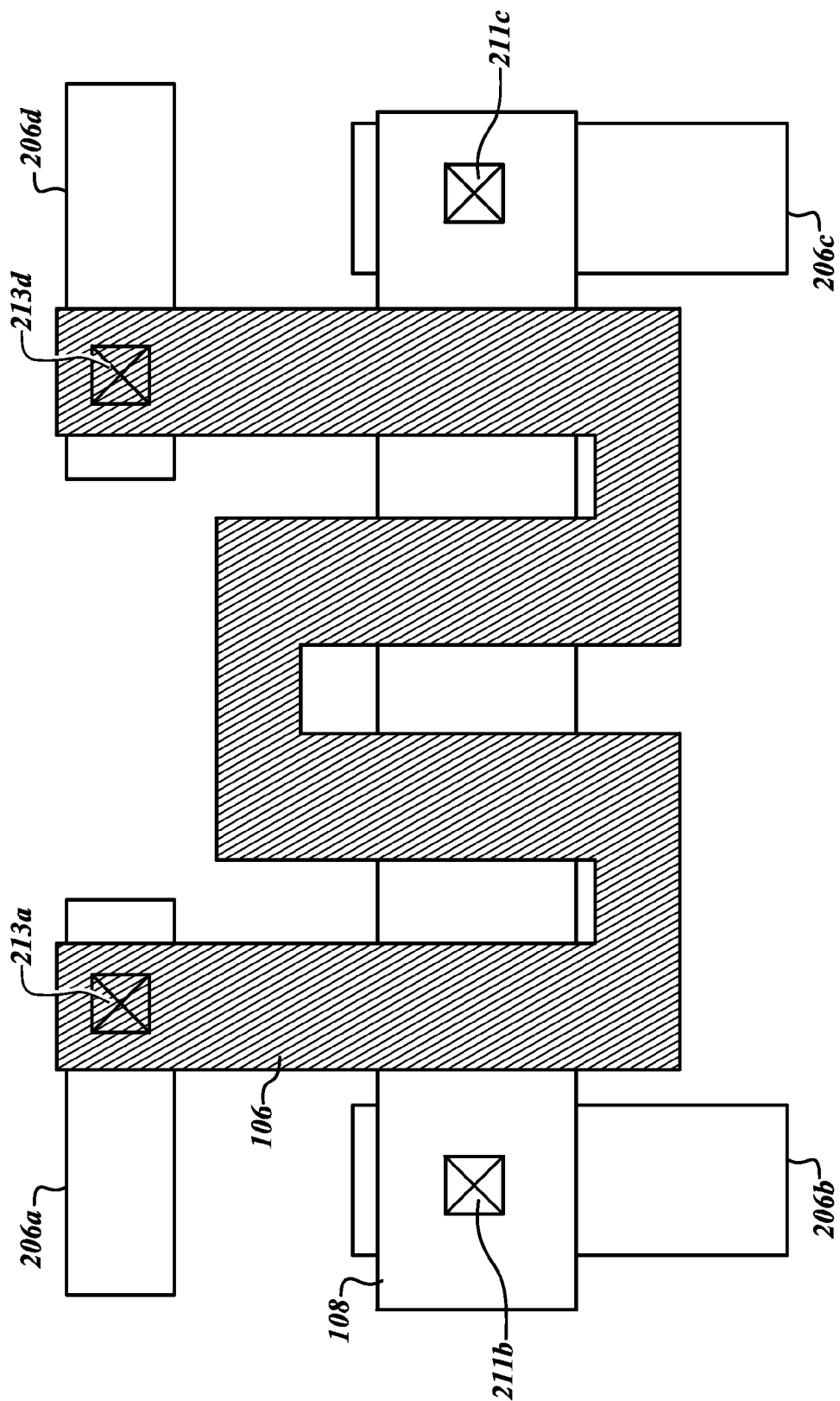
FIG. 13 is a partial-layer top view of the heater and trimmable resistor, in accordance with another embodiment of the invention.

FIG. 13 is an example of one embodiment of a top view of FIG. 12 showing the orientation of heater 106 and resistor 108. FIG. 13 shows heater 106 crossing back and forth over resistor 108 in a serpentine shape. Via connections 213a and 213d illustrate electrical connections between heater 106 and metal layer 206a and 206d, and via connections 211b and 211c illustrate connections between resistor 108 and metal layer 206b and 206c. The duration or number of exposures of resistor 108 to heat will vary depending upon the shape of the heater 106. Other shapes may be implemented that are equivalent to perform the function of heating resistor 108 with heater 106 to a temperature sufficient to permanently vary the resistance of resistor 108.

Figure 14:
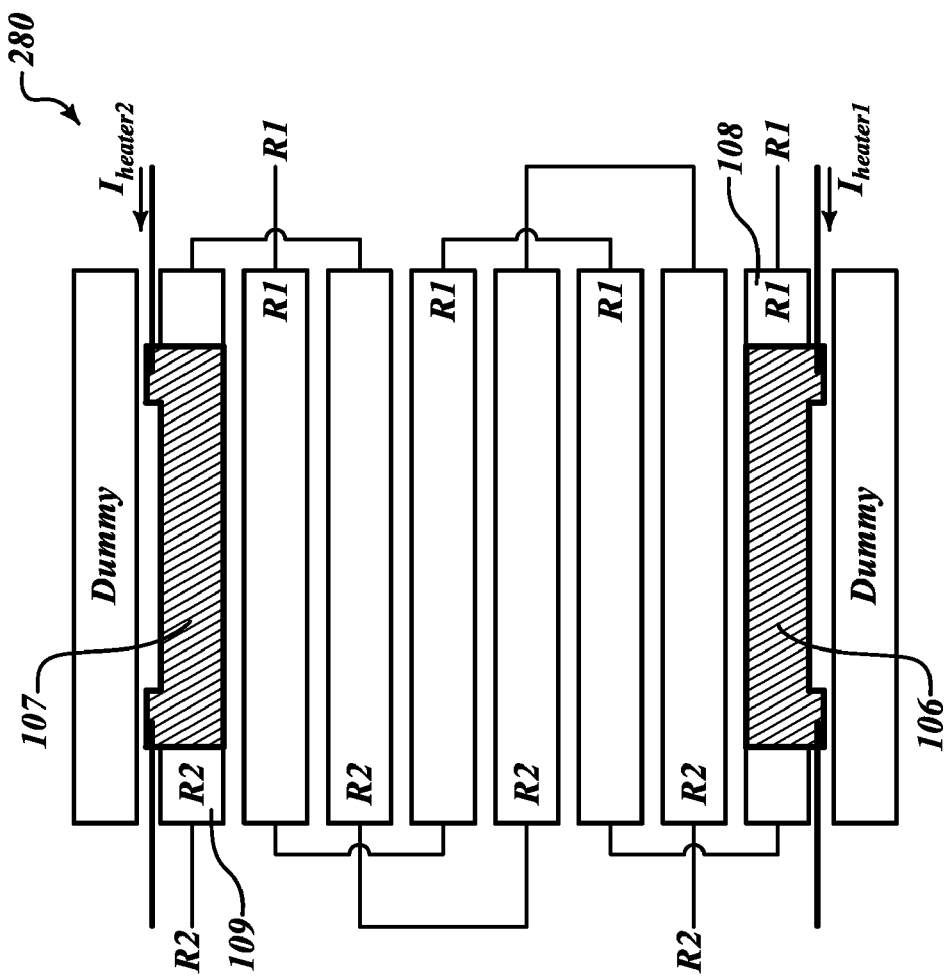
FIG. 14 is a layout view of a pair of trimmable resistors and resistor heaters, in accordance with an embodiment of the invention.

FIG. 14 shows interdigitated layout 280 illustrating an embodiment of the current invention. Resistive network 280 includes resistor 108, resistor 109, heater 106, heater 107, and dummy resistor cells. Dummy resistor cells are placed on either end of the interdigitated resistors to assist with better resistor matching. They can be used as test sites to test the actual value of the resistor before trimming so that the trimming will have an accurate starting point. They will have appropriate connection lines so that their resistance can be measured from terminals or contact pads outside of the die or in a packaged chip. In this embodiment only one cell of each of resistor 108 and resistor 109 is overlapped by a heater. This embodiment has the effect of an even more precise fine tuning because three-fourths of resistors 108 and 109 will be largely unaffected by the application of $I_{heater1}$ to heater 106 or $I_{heater2}$ to heater 107. In another embodiment, more or less of a single cell of resistors 108 and 109 is overlapped by heaters 106 and 107 to affect the precision of trimming the resistor. In yet another embodiment, more cells of resistor 108 or resistor 109 are overlapped by heater 106 or heater 107 to increase the influence of each heater on the sheet resistance, and therefore overall resistance, of the resistors. Generally, resistor fabrication recipes can be considered an estimate or course trim of the final values of resistors 108 and 109, and using heaters 106 and 107 to change the resistance of resistors 108 and 109 can be considered a fine or precision trim of the final values of the resistors.

Figure 19:
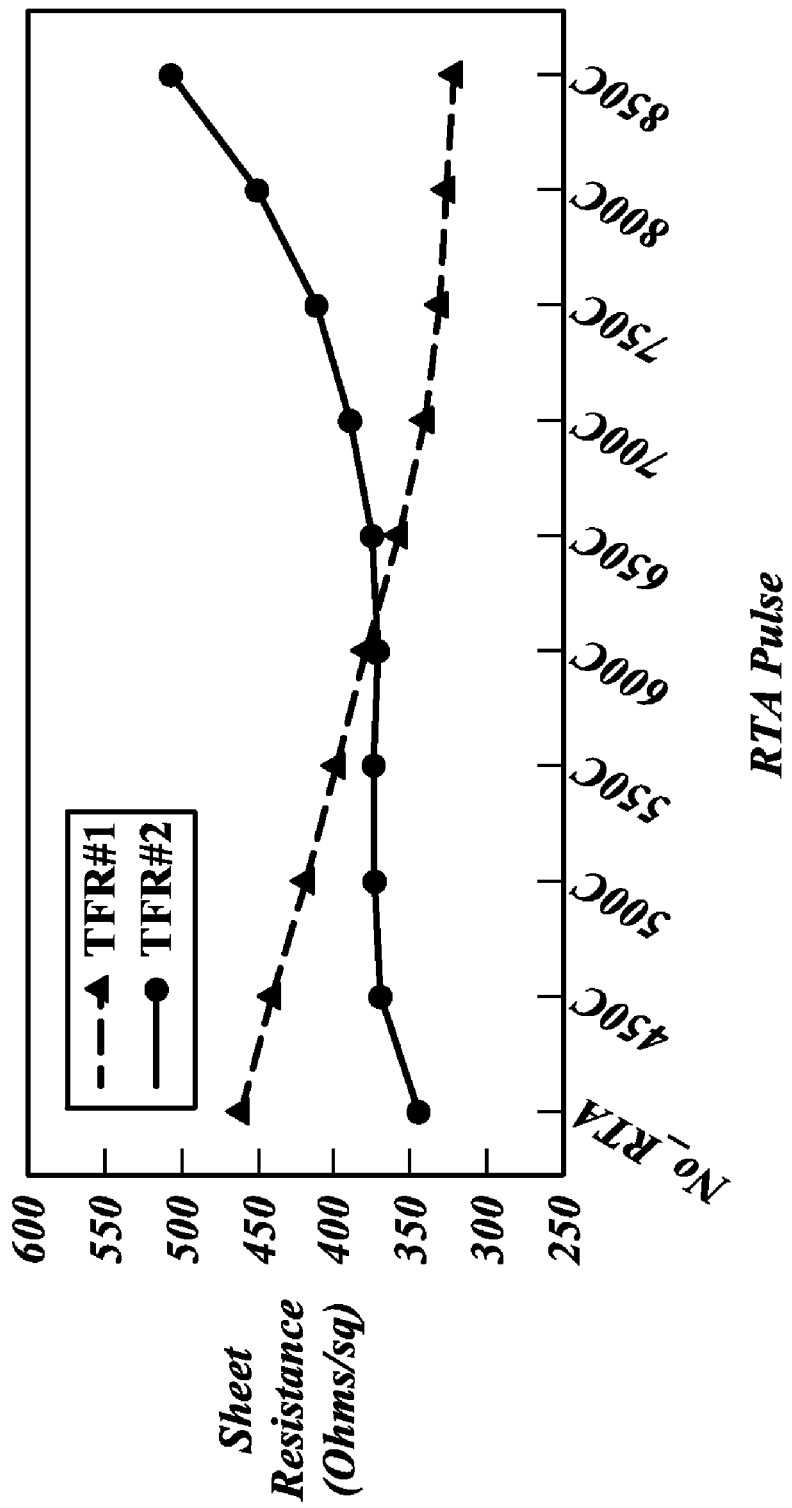
FIG. 19 is a chart illustrating how the sheet resistance of a trimmable resistor may permanently change with temperature, in accordance with an embodiment of the invention.

In one embodiment, resistor 108 is a type of resistor which increases its resistance value when heated, and resistor 109 is a type of resistor which decreases its resistance value when heated. Accordingly, a user or maker can use a fuse to connect either resistor 108 or resistor 109 into the circuit to increase the resistance by utilizing heater 106 or to decrease the resistance by utilizing heater 107. FIG. 19 illustrates how two resistors, each having an initial sheet resistance of 1 k ohm/sq, may react to the 450° C. to 850° C. temperature range, in accordance with an embodiment of the invention. In one embodiment resistor 108 and resistor 109 are connected in series and are used to represent a single resistor, such as Rsense or R1 of FIG. 17. In one embodiment, resistor 108 and resistor 109 are connected in parallel and used to represent a single resistor, such as Rsense or R1 of FIG. 17. In these embodiments, no fuse is used, rather both resistor 108 and resistor 109 are in series (or parallel) to provide the target resistance. Each is made of a different material and has one or more segments. If it is desired to increase the resistance, then resistor 108 is heated and if it is desired to decrease the resistance, then resistor 109 is heated.

Figure 15:
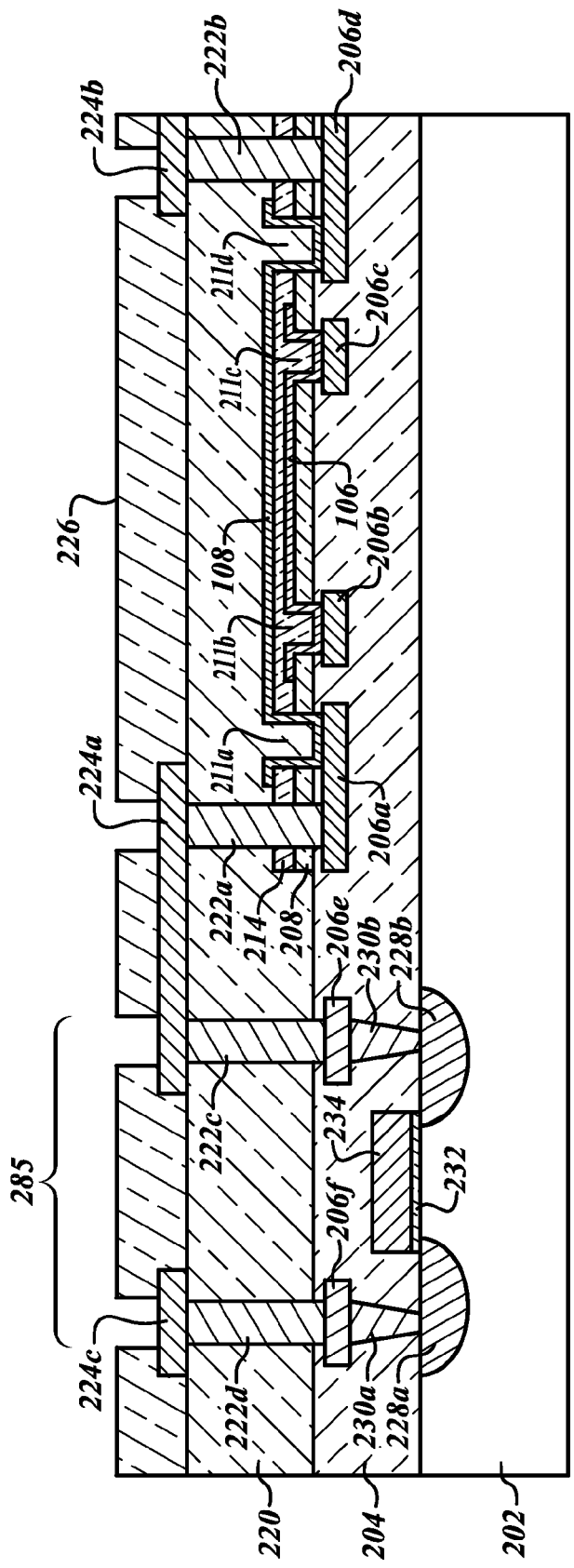
FIG. 15 is a cross-sectional view of various layers of the heater, the trimmable resistor, and a transistor, in accordance with an embodiment of the invention.

FIG. 15 is a depiction of trimming system 100 as it may be coupled to a nearby device. FIG. 15 shows trimming system 100 coupled to a transistor 285. Transistor 285 includes a source 228a, a drain 228b, a contact 230, an oxide layer 232, and a gate 234. The transistor 285 may correspond to the switch 104 or it may be one transistor in the circuit, such as with an op amp, as shown in FIG. 15.

FIG. 15 exemplifies how resistor 108 (now on top of heater 106), might be connected to additional devices. Metal layer 224a couples plug 222a with plug 222c. Plug 222c is adjacent to metal layer 206e. Metal layer 206e is adjacent to contact 230b which attaches to drain 228b. Oxide layer 232 is under gate 234 and is above drain 228b and source 228a. The gate is also connected to metal with a contact and via plug, but these elements are not shown in this figure. Source 228a is connected to contact 230a. Contact 230a is adjacent to metal layer 206f which is adjacent to plug 222d. Plug 222d is also adjacently connected to metal layer 224c. Metal layer 224c may be connected to another device or circuit through a lateral extension of metal layer 224c, as shown in 224a, or it may be electrically connected by wire-bonding or a series of additional plugs and metal layers. As will be appreciated by one of ordinary skill in the art, transistor 285 formed with gate 234 is just an example of a device that may be coupled to resistor 108, hence this example is not to be interpreted as the only configuration available.

FIG. 16 shows an amplifier circuit 300 using a trimmable resistor in accordance with an embodiment of this invention. Amplifier circuit 300 exemplifies the proportional influence a trimmable resistor may have on the gain of a circuit. Amplifier circuit 300 includes an input signal Vin, a resistor 304, an operational amplifier ("op amp") 306, an output voltage Vout, a trimmable resistor 310, a heater 312, circuitry 316, a transistor 318, and a heater control signal Vhcs.

As has been described previously, heater 312 selectively receives a current I from transistor 318 which is controlled by heater control signal Vhcs. In one embodiment heater control signal Vhcs is a single pulse. In another embodiment, heater control signal Vhcs is a series of pulses that can be applied from an outside terminal or controlled by a computer program. The computer program is stored in a computer-readable medium such as a disk, a memory, or the like. Circuitry 316 represents additional circuit elements that may be placed between transistor 318 and heater 312. In one embodiment, circuitry 316 is merely a straight line conductor. In another embodiment circuitry 312 includes additional transistors for current control or voltage regulation. Heater 312 selectively increases in temperature in response to current $I_{heat}$ flowing from transistor 318. The heat from heater 312 is transferred through a dielectric, like air or $SiO_2$, to permanently change the resistance of trimmable resistor 310.

Trimmable resistor 310, also labeled Rfb, is part of an inverting amplifier configuration. The output of op amp 306 is fed back to the inverting input of op amp 306. The feedback configuration of Rfb proportionally affects output voltage Vout as follows:

$$Vout=-Vin*Rfb/R1.$$

Thus, changes in Rfb or variations in Rfb from its designed value proportionally affect the gain of the circuit. The ability to permanently modify the value of Rfb at any time after the fabrication process so that the resistance aligns more closely with the desired value can greatly tighten tolerances and improve performance of circuit implementations.

Figure 17A:
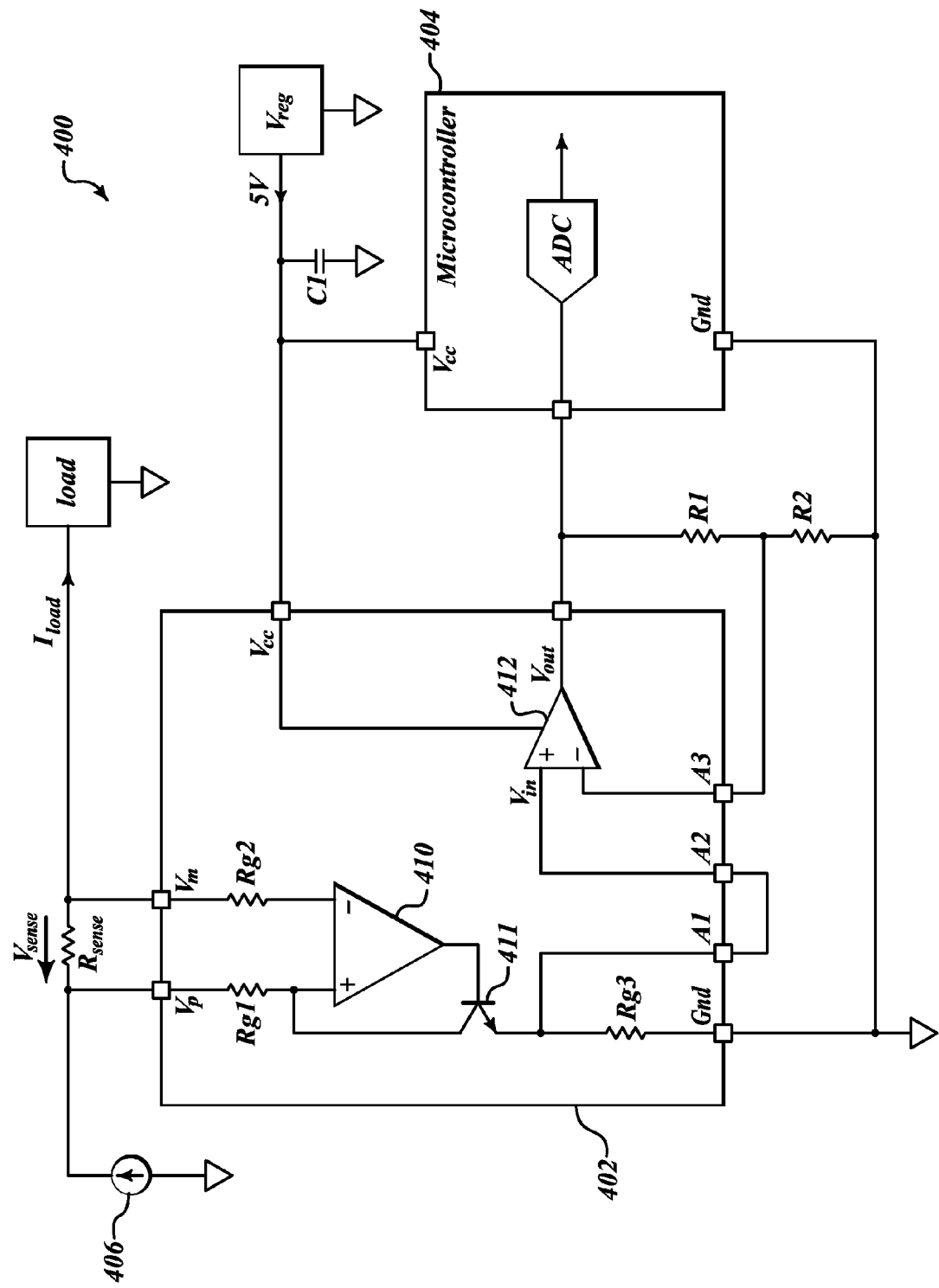
FIGS. 17A and 17B are circuit diagrams illustrating an integrated circuit using the trimmable resistor, in accordance with an embodiment of the invention.

FIG. 17A exemplifies additional uses of a trimmable resistor in accordance with an embodiment of the present invention as used in integrated circuit ("IC") system 400. IC system 400 shows an IC sense amp 402 connected to provide an output signal to an IC microprocessor 404. IC system 400 also includes circuitry external to IC sense amp 402 and IC microprocessor 404, such as a current source 406, a shunt resistor Rsense, a load, a voltage regulator Vreg, a decoupling capacitor C1, gain resistors R1 and R2, and a connection to ground.

IC sense amp 402 receives an input at Vp (voltage plus) and Vm (voltage minus) terminals and, in this configuration, produces an output on the Out terminal of IC sense amp 402. Current source 406 forces a current through shunt resistor Rsense to the load. As a result of the current flowing from current source 406, electric potential Vsense develops across the terminals of shunt resistor Rsense. Electric potential Vsense is passed through resistors Rg1 and Rg2 to the corresponding + and − inputs of op amp 410. The difference in electrical potential across inputs + and − of op amp 410 is proportionally increased by the gain of op amp 410 and transferred to the base of transistor 411. Assuming Rg1, Rg2, and Rg3 are equal, a voltage proportional to Vsense will be transmitted via transistor 411 and resistor Rg3 to Vin, the + input of op amp 412.

Op Amp 412 is configured to be a non-inverting amplifier. The relationship between Out, Vin, R1, and R2 is:

$$Out=Vin*1+R2/R1=Vin*(R2+R1)/R1.$$

Thus, the Out terminal of IC sense amp 402 is proportional to Vin as well as to the sum of R2 and R1. It should be noted that when R1 is significantly larger than R2 then the non-inverting amplifier configuration of op amp 412 resembles a follower (Out~=Vin).

In one embodiment, Rsense is a thin film trimmable resistor which has a resistance that can be increased or decreased in accordance with an embodiment of the present invention.

In another embodiment, one or more of the resistors described in IC system 400 are implemented with thin film trimmable resistors which have resistances that can be selectively increased or decreased in accordance with an embodiment of the present invention.

In another embodiment, IC sense amp 402 is a high sense amp which can be used as a high voltage capacitance filter to make it robust in an electromagnetic environment. It can also be used to provide CEM protection because high voltage capacitances have ultra low density.

Figure 17B:
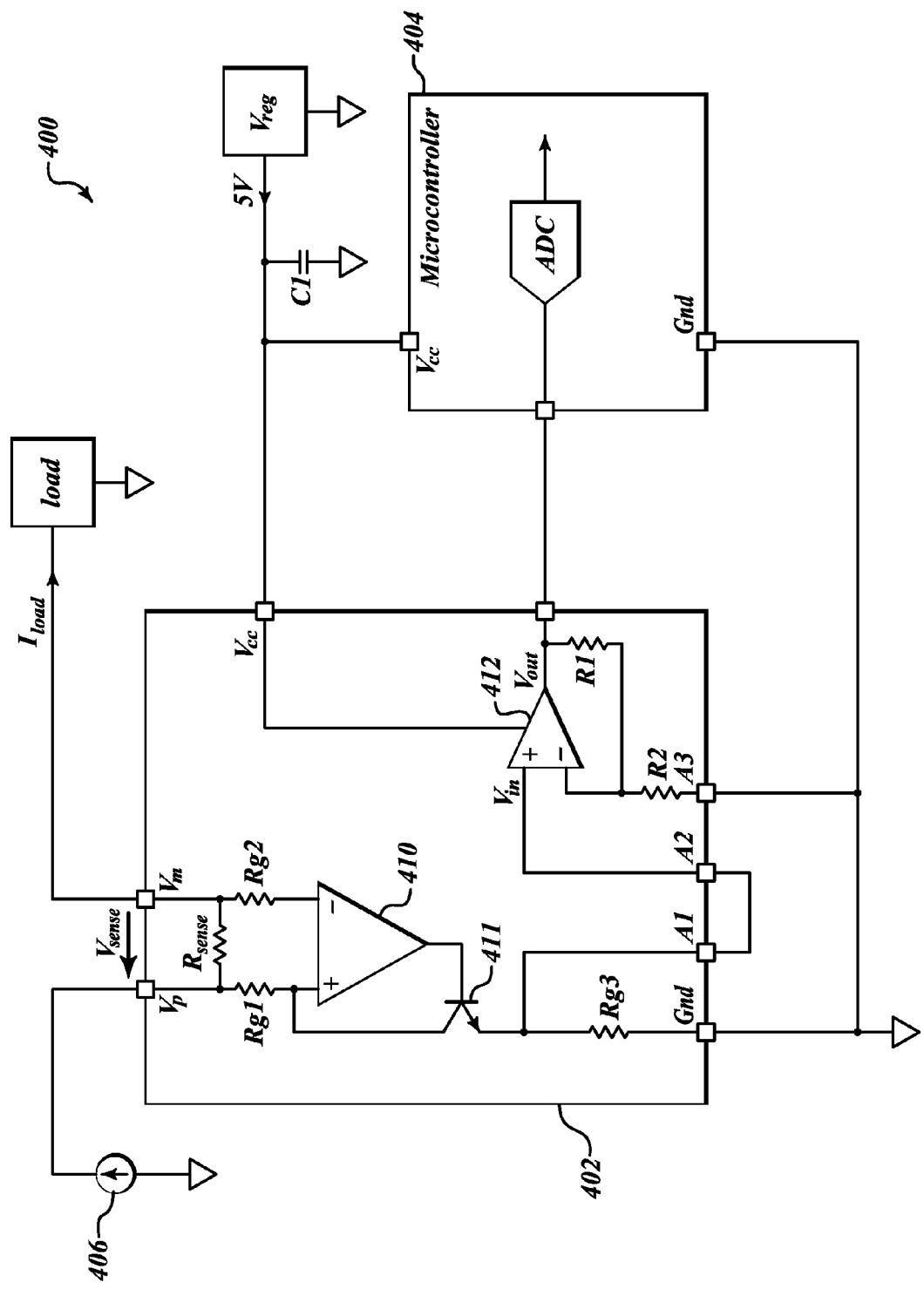

FIG. 17B illustrates IC system 400 having the features of FIG. 17A in addition to having Rsense, R1, and R2 internal to integrated circuit 402. Previously, a precision resistor such as Rsense had to be an external resistor because resistor tolerances on integrated circuits tend to vary widely. Since it was very difficult to manufacture precision resistances to an exact value within tight tolerances in integrated circuits, until this invention, Rsense was required to be an external resistor.

Rsense had to be an external resistance for two reasons. First a user had to choose the needed value within a tolerance, and second, the user had to choose a course value that would interact appropriately with a large or small load. However, in accordance with this invention we have the advantage of being able to have Rsense be part of the integrated circuit. Rsense no longer has to be a component external to the integrated circuit requiring a user to purchase and assemble additional components. The user now has the ability to select the value of Rsense to achieve both a higher or lower resistance as well as trim it to a precise value of the resistance. Accordingly, what used to be a time consuming and expensive process of purchasing the correct resistor and connecting it into a circuit design is no longer necessary. The key resistor, Rsense is now included in silicon on the integrated circuit. The user can now just program the value of Rsense based on the desired end use. In one embodiment each of Rsense, R1, and R2 are all integrated into the same integrated circuit die and are trimmable in accordance with an embodiment of the present invention. Any of the resistances, including any of the internal resistances Rg1, Rg2, and Rg3 can be trimmable using the techniques of this invention. Accordingly, the user will now have the ability to customize the circuit by choosing the precise desired resistances in accordance with the desired end use, thus saving considerable money, time, and having a better performing and higher quality end product.

FIGS. 18A-18C illustrate different steps that may occur in methods for trimming a resistor 500, in accordance with an embodiment of the present invention. This method will be discussed in the context of trimming system 100 of FIG. 1. However, it is to be understood that the steps disclosed herein may be varied in accordance with other embodiments of the invention.

Each of the methods of trimming described herein, including those shown in FIGS. 18A-18C, can be carried out at various stages during the manufacturing process. In a first embodiment, they are carried out at the wafer test stage as performed by the manufacturer. In alternative embodiments, the wafer trimming steps can be carried out after the wafer has been diced and the individual dies are being tested during packaging. The invention has particular advantages when used in a package chip. For high precision circuits, it has been found that packaging sometimes induces parameter shift and precision loss. In addition, packaging can have effects on various components in the circuit, slightly modifying the performance of different transistors, amplifier circuits, and different structures, once the chip is fully packaged. This may be for various reasons, including the conditions which the die encounters during packaging, and also because of the electrical connection changes which take place when the die is placed inside a package, ball bonded to a lead frame, and then connected to terminals outside the package. It has been found that in some example circuits having standard amplifiers, audio amplifiers, high speed circuits, and current sensing, that the packaging steps provide sufficient modification to the circuit that resistor trimming is sometimes best performed after the packaging has been completed. Accordingly, according to one embodiment, the resistor trimming steps shown in FIGS. 18A-18C are carried out after the packaging has been completed.

As described herein, all of the acts comprising the method may be orchestrated by a manufacturing processor or controller based at least in part on execution of computer-readable instructions stored on a disk or in memory. In other embodiments, a hardware implementation of all or some of the acts of the manufacturing method may be used.

FIG. 18A is a flowchart illustrating an embodiment of a method of trimming a resistor. Generally, the embodiment of FIG. 18A relates to a method of trimming a resistor having a known value while a more desirable end value of the resistor is sought. One seeking to implement this method would typically understand the characteristics of the resistor being trimmed. That is, to change the resistance of the resistor by some desired number of ohms or ohms/sq, the temperature and duration of the temperature of resistor exposure should already be known. In one embodiment, a chart, table, database, or the like is used to determine how long resistor 108 must be exposed to a certain temperature to effect the desired change. Hence, FIG. 18A illustrates a system without feedback while trimming a resistor where the current value is known, a new value is desired, and a temperature and duration are chosen to cause the value of the resistance to change from the current value to the new desired value.

In step 505, the resistance of resistor 108 is determined. This can be performed by many methods, including: directly measuring resistor 108 with a voltmeter; measuring a circuit containing resistor 108 and calculating the resistance based upon the values of interrelated circuit elements; or measuring a similarly composed material deposited in a wafer scribe line, deposited in a corner of an individual die, or the like. In one embodiment, a test structure made of exactly the same layer as the resistor is made at a location on the wafer that can be easily probed. For example, if the resistor to be trimmed is made in polysilicon, a relatively large strip of polysilicon located in the scribe line or at a testable location can be formed at the same time, using the same process steps as the resistors in the circuit. The actual resistor itself cannot be tested, but the sheet resistance of the corresponding structure in the scribe line can be tested and the exact value of the resistance, as formed can thus be known. The amount of change needed in the resistance to achieve the target performance can therefore be known and the value of the resistor can be changed by this amount.

In step 510, switch 104 is selectively pulsed to cause a pulse or series of pulses of current to flow through heater 106 which is adjacent to resistor 108. Current flows through switch 104 because it is coupled to a voltage source $V_h$. To protect heater 106 as well as the dielectric which is separating heater 106 from resistor 108, the current applied to heater 106 will need to be short enough to prevent overheating. The duration of the pulse will depend upon the amplitude of the voltage applied and the resistance of heater 106; however, application of the voltage will resemble a current or voltage pulse. The pulse may take the form of a square wave pulse, a triangle wave pulse, a sinusoidal wave pulse, or the like. The pulse needs to bring heater 106 to a temperature high enough to place resistor 108 in the range of 450° C. and 850° C.

In step 515, heater 106 reaches the desired temperature to cause temperature of resistor 108 to enter the range of 450° C. and 850° C. In one embodiment, a chart, table, database, or the like is used to determine how long resistor 108 must be exposed to a certain temperature to effect the desired change. In one embodiment the resistance of resistor 108 permanently decreases in value as the temperature of resistor 108 increases, as depicted by TFR#1 (thin film heater) of FIG. 19. In another embodiment the resistance of resistor 108 permanently increases in value with temperature increase, as depicted by TFR#2 of FIG. 19. It is noteworthy that the resistance of TRF#2 of FIG. 19 increases by approximately 85% and the resistance of TFR#1 decreases by approximately 25% within the range of 450° C. and 850° C. In one embodiment the initial sheet resistance of the resistors represented by TFR#1 and TFR#2 is 1 k ohm/sq. Other materials or longer resistors can be used to cause more changes in the resistance value in order to accommodate a larger range, such as a doubling or tripling of the resistance, or cutting it by half or one-third.

Step 520 shows selectively disconnecting heater 106 from the voltage source after resistor 108 has reached the approximate desired temperature. This method utilizes predetermined temperature and duration data to produce a desired change in the resistance of resistor 108 in a single progression through steps 505, 510, 515, and 520.

FIG. 18B is a flowchart illustrating another embodiment of a method of trimming a resistor. In contrast to the method of FIG. 18A, FIG. 18B illustrates an embodiment of an iterative method of trimming a resistor. Rather than exposing resistor 108 to a particular temperature for a predetermined duration, this embodiment illustrates incrementally approaching a desired final resistance value. This embodiment will, depending upon the increments in resistance per iteration, produce a much more accurate result that the embodiment of FIG. 18A. The cost for the more precise result is the time consumed by iterating between several of the steps discussed below.

In step 505, the resistance of resistor 108 is determined. As discussed, this can be performed by many methods, including: directly measuring resistor 108 with a voltmeter; measuring a circuit containing resistor 108 and calculating the resistance based upon the values of interrelated circuit elements; or measuring a similarly composed material deposited in a wafer scribe line, deposited in a corner of an individual die, or the like.

In step 510, switch 104 is pulsed a single time to cause a pulse of current to flow through heater 106 which is adjacent to resistor 108. Current flows through switch 104 because it is coupled to a voltage source $V_h$. The duration of the pulse will depend upon the amplitude of the voltage applied, the resistance of heater 106, and the desired resolution of incremental changes in resistance. The finer the resolution of the incremental changes, the closer the final value of resistor 108 will be to the desired final value of resistor 108.

In step 517, it is determined whether resistor 108 has reached the desired value of resistance. If the desired value has not yet been reached, then the method would iteratively return to step 505 to determine the resistance of resistor 108, continue to step 510 to pulse switch 104, and return to step 517. If the desired value of resistor 108 had been reached, the method continues to step 520. Additionally, if the desired value of resistor 108 had not been reached, but the resolution of increments is course enough that an additional iteration would result in surpassing the desired value of resistance, then this too would result in progressing to step 520.

Step 520 shows selectively disconnecting heater 106 from the voltage source by discontinuing pulses to switch 104. This step is performed after resistor 108 has reached the desired temperature and resistance value. From here one would restart the process of trimming again only if the circuit, in which the resistor is incorporated, required additional tuning.

FIG. 18C is a flowchart illustrating another embodiment of a method of trimming a resistor. This embodiment includes utilizing the output of integrated circuit 101, into which resistor 108 is incorporated, to determine how much a resistance needs to be adjusted. Unlike the embodiments of both FIGS. 18A and 18B, the initial value of resistor 108, in isolation, is unknown. In many cases access to individual resistors is not available; however access to circuitry output, such as the gain of an amplifier, likely will be available. In such a scenario, the embodiment of FIG. 18C, a performance based trimming method, becomes very useful.

In step 522, circuit 101 is tested to measure its performance. In one embodiment, circuit 101 includes a low-pass or high-pass filter and testing the circuit includes measuring the cutoff frequency. In one embodiment, testing circuit performance includes testing a sense amp with a known current. In another embodiment, circuit 101 includes an amplifier configuration similar to that of FIG. 16. For example, if Rfb is initially 4.2 k ohms and R1 is 1 k ohm, the gain (Vout/Vin) will be −4.2. If however, a gain of −5 is desired the content of step 524 is performed to produce the desired result.

In step 524, the value of resistor 108 that would produce the desired result is calculated. Continuing the example of the configuration of FIG. 16, where resistor 108 is Rfb of 4.2 k, one would understand that the value of Rfb would need to be increased to 5 k ohms to get a desired gain of −5. The user would need access to heater 106 to accomplish the precision trimming of the circuit, but the user would not be required to have direct access to the actual resistor being trimmed, whether to measure or modify. A voltage is provided to selected pins of the package that correspond to the heater. It is not necessary to blow a fuse or provide access to the resistor to trim it, rather, the trimming can be done with standard voltages and connecting normally available package pins to the outside and the resistor can read the desired value using electrical programming on the finished product. This is clearly an advantage over the prior art.

Similarly, the embodiment of FIG. 17B also illustrates the immense utility in trimmable resistors within an IC. Specifically, the gain of op amp 412 is controlled by R1 and R2. A user can measure the output of op amp 412 at Vout and make determinations based on the difference between the output measured and the output expected. The user can determine which resistor R1 or R2 to change and how much to change it to produce the designed gain. Additionally, using internal trimmable resistors R1 and R2 saves: space by drastically reducing the size of the overall system, the time consumed in connecting external resistors to the system, and the cost of purchasing additional resistors to add to the system.

Lastly, step 526 includes applying a voltage to heater 106 to cause the previous value of resistor 108, R1, or R2 to change to the calculated value of the resistor, thereby tuning the circuit 101 to perform closer to the target performance. The resistor can have its value changed in step 526 using either the method steps of FIG. 18A or 18B, or other acceptable method.

In one embodiment, the resistors of FIGS. 16 and 17 are implemented as two trimmable resistors in series, where each resistor has its own independent heater. Furthermore, as described with respect to FIG. 14, one of the resistors could have a resistance that increases when heated to a particular temperature and the other resistor in the series could have a resistance that decreases when heated to a particular temperature. Thus, a user would have the option to either increase or decrease the resistance of a resistor comprised of two segments in series which are composed of different resistive materials. It is to be understood that while FIGS. 18A through 18C describe different embodiments of methods by which to test and trim resistor 108, various other methods exist that are not explicitly disclosed here but that adhere to the spirit of these embodiments.

The foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more programs executed by one or more processors, as one or more programs executed by one or more controllers (e.g., microcontrollers), as firmware, or as virtually any combination thereof, and that designing the circuitry and/or writing the code for the software and or firmware would be well within the skill of one of ordinary skill in the art in light of this disclosure.

When logic is implemented as software and stored in memory, it would be equivalent that logic or information can be stored on any computer readable storage medium for use by or in connection with any processor-related system or method. In the context of this document, a memory is a computer readable storage medium that is an electronic, magnetic, optical, or other physical device or means that contains or stores a computer and/or processor program and/or data or information. Logic and/or the information can be embodied in any computer readable storage medium for use by or in connection with an instruction execution system, apparatus, or device, such as a computer-based system, processor-containing system, or other system that can fetch the instructions from the instruction execution system, apparatus, or device and execute the instructions associated with logic and/or information.

The various embodiments described above can be combined to provide further embodiments. From the foregoing it will be appreciated that, although specific embodiments have been described herein for purposes of illustration, various modifications may be made without deviating from the spirit and scope of the teachings. Accordingly, the claims are not limited by the disclosed embodiments.

We claim:

1. A trimmable resistance structure, comprising:
   an integrated circuit die having components in a semiconductor substrate;
   a resistive structure in the integrated circuit die composed of a material whose resistance is permanently changeable by application of heat thereto;
   a dielectric in the integrated circuit die disposed adjacent to the resistive structure;
   a heater in the integrated circuit die disposed adjacent to the dielectric, the dielectric being disposed so as to separate the heater from the resistive structure; and
   a switch in the integrated circuit die configured to selectively couple the heater to a voltage supply that will cause heat from the heater to heat the resistive structure to cause a permanent change in the resistive structure.

2. The structure of claim 1 wherein the resistive structure, the heater, and the dielectric material are thin films.

3. The structure of claim 1 wherein the voltage supply is capable of sourcing a voltage sufficient to increase the temperature of the heater to at least 450° C.

4. The structure of claim 1 wherein the heater is in a serpentine shape.

5. The structure of claim 1 wherein the dielectric includes $Si_3N_4$.

6. The structure of claim 5 wherein the resistive structure includes CrSi.

7. A resistor trimming method, comprising:
   applying a voltage to a heater in an integrated circuit die through a switch in the integrated circuit die;
   heating a resistive structure in the integrated circuit die adjacent to the heater;
   permanently changing the resistance value of the resistive structure during the heating step; and
   removing the voltage from the heater.

8. The method of claim 7 wherein the resistive structure, the heater, and the dielectric material are thin films.

9. The method of claim 7 wherein applying the voltage comprises applying a voltage pulse to the heater.

10. The method of claim 7 wherein heating the resistive structure includes heating the resistive structure in excess of 450° C.

11. The method of claim 10 wherein heating the resistive structure decreases the resistance of the resistive structure.

12. A circuit, comprising:
    an integrated circuit die;
    an amplifier in the integrated circuit die;
    a trimmable thin film resistor in the integrated circuit die electrically coupled to the amplifier, a gain of the amplifier being based in part on a resistance of the trimable thin film resistor;
    a thin film heater in the integrated circuit die thermally coupled to the trimmable thin film resistor;
    a transistor in the integrated circuit die and electrically coupled to the thin film heater and configured to selectively pass a current through the thin film heater to increase a temperature of the trimable thin film resistor to permanently alter the resistance of the trimable thin film resistor; and
    a thin film thermal separator disposed between the trimmable thin film resistor and the thin film heater.

13. The circuit of claim 12 wherein the thin film heater is a thin film resistor.

14. The circuit of claim 13 wherein the resistance of the thin film heater is less than the resistance of the trimmable thin film resistor.

15. The circuit of claim 12 wherein the resistance of the trimmable thin film resistor permanently changes with exposure to a temperature within a range of temperatures.

16. The circuit of claim 15 wherein the range of temperatures includes 450° C. to 850° C.

17. The circuit of claim 12 wherein the thin film thermal separator is a dielectric.

18. The circuit of claim 17 wherein the thin film thermal separator includes $Si_3N_4$.

19. The apparatus of claim 12 wherein the trimmable thin film resistor includes CrSi.

* * * * *